US006443179B1

(12) United States Patent
Benavides et al.

(10) Patent No.: US 6,443,179 B1
(45) Date of Patent: Sep. 3, 2002

(54) PACKAGING OF ELECTRO-MICROFLUIDIC DEVICES

(75) Inventors: Gilbert L. Benavides, Albuquerque, NM (US); Paul C. Galambos, Albuquerque, NM (US); John A. Emerson, Albuquerque, NM (US); Kenneth A. Peterson, Albuquerque, NM (US); Rachel K. Giunta, Albuquerque, NM (US); Robert D. Watson, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/790,423

(22) Filed: Feb. 21, 2001

(51) Int. Cl.[7] .................................................. F16K 27/00
(52) U.S. Cl. ................... 137/454.2; 137/597; 285/120.1
(58) Field of Search ............................... 137/594, 597, 137/606, 607, 454.2, 454.6, 833; 285/120.1, 122.1, 124.3

(56) References Cited

U.S. PATENT DOCUMENTS

| 3,654,947 A | * | 4/1972 | Hatch et al. ................. 137/833 |
| 5,640,995 A | | 6/1997 | Packard et al. ............. 137/597 |
| 5,964,239 A | | 10/1999 | Loux et al. ................... 137/15 |
| 6,102,068 A | * | 8/2000 | Higdon et al. ............... 137/269 |
| 6,136,212 A | | 10/2000 | Mastrangelo et al. ......... 216/49 |

OTHER PUBLICATIONS

Co–pending US patent application "Packaging of Electro-Microfluidic Devices", G. Benavides, et al, commonly assigned to Sandia Corporation, Albuquerque, New Mexico, Docket No. SD–6816.

T. Merkel, M. Graeber and L. Pagel, "A new technology for fluidic microsystems based on PCB technology", Sensors and Actuators 77 (1999) pp. 98–105.

(List continued on next page.)

*Primary Examiner*—Stephen M. Hepperle
(74) *Attorney, Agent, or Firm*—Robert D. Watson

(57) ABSTRACT

A new architecture for packaging surface micromachined electro-microfluidic devices is presented. This architecture relies on two scales of packaging to bring fluid to the device scale (picoliters) from the macro-scale (microliters). The architecture emulates and utilizes electronics packaging technology. The larger package consists of a circuit board with embedded fluidic channels and standard fluidic connectors (e.g. Fluidic Printed Wiring Board). The embedded channels connect to the smaller package, an Electro-Microfluidic Dual-Inline-Package (EMDIP) that takes fluid to the microfluidic integrated circuit (MIC). The fluidic connection is made to the back of the MIC through Bosch-etched holes that take fluid to surface micromachined channels on the front of the MIC. Electrical connection is made to bond pads on the front of the MIC.

78 Claims, 33 Drawing Sheets

OTHER PUBLICATIONS

C. Cotofana, A. Bossche, P. Kaldenberg, J. Mollinger, "Low-cost plastic sensor packaging using the open–window package concept", Sensors and Actuators A 67 (1998) pp. 185–190.

E. T. Enikov and J. G. Boyd, "Electroplated electro–fluidic interconnects for chemical sensors," Sensors and Actuators 84 (2000) pp. 161–164.

P. Galambos and G. Benavides, "Electrical and Fluidic Packaging of Surface Micromachined Electro–Microfluidic Devices," Microfluidic Devices and Systems III, Proceedings of SPIE—The International Society of Optical Engineering, vol. 4177, 2000, pp. 200–207.

J. Voldman, M. L. Gray, M. A. Schmidt, "An Integrated Liquid Mixer/Valve," Journal of Microelectromechanical Systems, vol. 9, No. 3, Sep. 2000, pp. 295–302.

C. Gonzalez, S. D. Collins, R. L. Smith, "Fluidic interconnects for modular assembly of chemical microsystems," Sensors and Actuators B49 (1998) pp. 40–45.

M. Schuenemann, V. Grosser, R. Leutenbauer, G. Bauer, W. Schaefer, H. Reichl, "A highly flexible design and production framework for modularized microelectromechanical systems," Sensors and Actuators 73 (1999) pp. 153–168.

K. Peterson and W. R. Conley, "*Pre–Release Plastic Packaging of MEMS and IMEMS Devices*" U.S. Patent Application 09/572,720.

J. J. Allen, P. C. Galambos, J. F. Jakubczak, T. W. Krygowski, S. Montgaue, C. A. Nichols, M. Okandan, P. H. Paul and J. H. Smith, "*Surface–Micromachined Microfluidic Devices*" U. S. Patent Application 09/712,634.

Color Handout, Electro Microfluidic Dual In–line Package (EMDIP), Sandia National Laboratories, SAND2001–3412P, Nov. 2001.

\* cited by examiner

SEC 1-1

SEC 1-1

SEC 1-1

PACKAGING OF ELECTRO-MICROFLUIDIC DEVICES

CROSS-REFERENCE TO RELATED APPLICATIONS

This application is related to co-pending U.S. patent application Ser. No. 09/712,634 "Surface-Micromachined Microfluidic Devices", filed Nov. 13, 2000, P. C. Galambos, et al., commonly assigned to Sandia Corporation, Albuquerque, N. Mex.

This application is also related to co-pending US patent application "Method of Packaging and Assembling Electro-Microfluidic Devices", by G. Benavides, et al., commonly assigned to Sandia Corporation, Albuquerque, N. Mex.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to packaging of microelectronic devices, and more specifically to packaging of electro-microfluidic devices.

Electro-microfluidic devices are electro-mechanical devices fabricated generally in silicon that control or utilize the flow of a fluid (e.g. liquid or gas). These devices may utilize Micro-Electromechanical-Systems (MEMS) elements, e.g. chemical sensors, biosensors, micro-valves, micro-pumps, micro-heaters, micro-pressure transducers, micro-flow sensors, micro-electrophoresis columns for DNA analysis, micro-heat exchangers, micro-chem-lab-on-a-chip, etc. Electro-microfluidic devices typically have very small fluid access ports, e.g. 100 microns; have a small overall footprint (e.g. 3 mm×6 mm); and are commonly made in silicon using processes developed by the MEMS and semiconductor IC industry. A common electro-microfluidic application is ink jet printer heads, which combine electric and fluidic functions on a low-cost, integrated platform.

An integrated microfluidic system incorporates electrical signals on-chip. Such electro-microfluidic devices require fluidic and electrical connection to larger packages. Therefore electrical and fluidic packaging of electro-microfluidic devices is key to the development of integrated microfluidic systems. Packaging is more challenging for surface micromachined devices than for larger bulk micromachined devices. However, because surface micromachining allows incorporation of electrical traces during microfluidic channel fabrication, a monolithic device results.

Despite the commercial success of low-cost ink jet printers, there are no commercially available standardized packages for housing electro-microfluidic devices. Each device has its own customized package, and what works for one device may not be appropriate for another device. Standardized packages do exist for microelectronic integrated circuits, e.g. Dual Inline Package (DIP), and their use has resulted in dramatically reduced costs of design and fabrication. A need exists, therefore, for a low-cost, standardized package suitable for housing an electro-microfluidic device. Common electrical fixtures, such as printed circuit boards, should accept a standardized electro-microfluidic package.

Microfluidic devices have potential uses in biomedical, chemical analysis, power, and drop ejection applications. Typically the use of microfluidics in these applications requires the integration of other technologies with microfluidics. For instance: optical means may be used to sense genetic content, electronics may be used for chemical sensing, electro-magnetics may be required for electrical power generation, or electrical power may be required for thermal drop ejection. The already difficult task of packaging the microfluidic device is compounded by the packaging required for electrical, optical, magnetic or mechanical interconnection. In addition, the full potential of microfluidics can not be realized until many microfluidic devices can be effectively integrated into microfluidic systems. This integration requires effective microfluidic interconnections as well as electrical, and/or optical and other types of interconnections. Of special importance for the application of microfluidics is the integration of electronics with microfluidics. This integration will allow the use of already well developed and extremely useful electronics technology with the newly emerging microfluidics technology.

Surface micromachining of microfluidic devices allows the integrated microfabrication of monolithic chips that contain both electrical and microfluidic devices. Integrated fabrication of surface micromachined Micro-Electro-Mechanical Systems (Integrated MEMS or IMEMS) with electronics has been used to fabricate air-bag accelerometer systems. However, integration of microfluidics and electronics on a single chip has lagged behind IMEMS development at least partly because of the difficulty in packaging microfluidic devices in a leak tight, efficient, inexpensive and reliable manner.

Several different techniques have been used to package microfluidic devices. These techniques do not typically address the problem of making electrical connection as well as fluid connection to the microfluidic devices. The simplest way to make fluid connections is to epoxy or otherwise adhere glass or capillary tubes over holes in the on-chip microfluidic channels. This method is very difficult to implement consistently at the very small scales involved without plugging the holes with adhesive. If one is making many connections, the tediousness and the sensitivity of this method to the amount of shaking in one's hand make this a very unattractive packaging option. Essentially one is performing very small scale, very meticulous, hand assembly work.

More efficient microfluidic connection techniques have been proposed. Tight fitting fluidic couplers can be used for standard capillary tubes. These couplers are created using Deep Reactive Ion Etching (DRIE) to fabricate cylindrical or annular access holes in a mounting wafer that is fusion bonded to the silicon module containing the microfluidic channels. Capillary tubing fits tightly into these access holes. After fitting the capillary tubes into the couplers, epoxy is applied to the outside of the tubing to seal the connection between the tubes and the couplers. In the most developed version of this technique a plastic fluid coupler fits into the access holes for better alignment and sealing.

A snap-together method can be used to connect microfluidic channels at the wafer scale. Finger micro-joints act as springs that hold the channels together after snapping the wafers into place. The connection is a reversible one. Microfluidic circuitboards have been described. In this package several different microfluidic devices are mounted on a circuitboard that contains embedded flow channels connecting the devices in a microfluidic circuit. Finally, a microfluidic manifold that is created in acrylic and contains channels can feed different microfluidic devices. The different layers of the microfluidic manifold are bonded together using thermal diffusion bonding under 45 psi of pressure.

All of these packaging techniques are typically used with bulk micromachined devices. For surface micromachined microfluidic devices the microfluidic device channels scales are even smaller. For instance, a typical bulk micromachined channel would have a channel depth of 50 to 100 microns (0.002 to 0.004 inches). Whereas a typical surface micromachined channel depth would be 1 to 5 microns (0.00008 to 0.0002 inches). The added challenges of connecting to these smaller microchannels, the limitations of current packaging technology, and the necessity of making electrical as well as fluidic connections to make integrated microfluidic microsystems have led us to develop the following packaging scheme.

Problems with packaging of electro-microfluidic devices can include leaks, plugging of microchannels, corrosion, and contamination of the process fluids by the materials of construction. As the size of electro-microfluidic device continues to shrink, the challenge is making reliable fluidic connections between micro-holes (e.g. 100 microns). A related challenge is reliably transitioning to meso-size holes (e.g. 500 microns), and finally up to miniature-size holes (e.g. 1/16 inch OD tubing). No practical solution is commercially available that solves the problem of transitioning fluidic connections from the microscale to the miniature-scale.

Making a reliable fluidic connection between two channels having microscale dimensions (e.g. 100 micron ID) is a critical problem. Conventional O-ring seals are not commercially available in these microsizes, and would be extremely difficult to handle at this scale, and in large numbers. Liquid adhesives, such as conductive epoxies, are commonly used for attaching IC dies to polymeric or ceramic substrates (e.g. die attach). However, the liquid adhesive can flow and plug microfluidic holes or channels during bonding. Likewise, solder sealring joints can suffer from microhole plugging during reflow. What is needed is an adhesive system for making microfluidic connections that can be scaled down to microsized holes (e.g. less than 100 microns) without causing plugging of microholes.

Voldman describes a scheme for making a fluidic connection to a microfluidic chip. See Voldman, Gray, and Schmidt, "An Integrated Liquid Mixer/Valve", Journal of Microelectromechanical Systems, Vol. 9, No. 3, September 2000, pp. 295–302. As shown in FIG. 1., a threaded screw with a hole drilled through the middle is butted up against a miniature O-ring seal (1 mm OD) that presses against the microfluidic chip, creating an internal compression seal. Small-diameter TYGON tubing (0.5 mm OD) is glued to the hollow screw to provide the fluid. While useful for one-of-a-kind prototype laboratory testing, this scheme is not well suited for miniaturization and mass production as a standardized package. Considering that an electro-microfluidic package may have an array of 20–40 microfluidic access ports on one side, handling this many individual micro O-rings becomes very difficult. Other one-of-a-kind laboratory schemes use glass microcapillary tubes bonded perpendicular to the plane of the electromicrofluidic chip.

Cotofana describes a low-cost transfer mould packaging concept for sensors using a open-window scheme. See Cotofana, et al., "Low-Cost Plastic Sensor Packaging Using the Open-Window Package Concept", Sensors and Acutators A 67 (1998) pp. 185–190. As shown in FIG. 2, an open-window has been created in the top of a standard transfer-molded plastic encapsulated package housing an electro-microfluidic device wirebonded to an electrical lead frame. A customized lid or cap, having inlet and outlet flow channel access, is glued across the open-window, thereby sealing the open-cavity and providing fluidic access to the upper surface of the sensor chip. Despite using a standardized plastic package, this scheme does not solve the problem of efficiently transitioning fluidic connections from multiple, microsized ports (e.g. 100 microns) located on the chip to the larger diameter connections located on an external fixture. Cotofana's scheme also constrains the fluid to flow only across the surface of the electro-microfluidic chip, rather than providing individual flow connections to internal channels disposed inside of the chip.

In U.S. Pat. No. 6,136,212, Mastrangelo, et al. describes an electro-microfluidic device (i.e. chip) wirebonded to a standard IC package (DIP or PGA), which includes fluidic interconnects located on the opposite side of the chip that are coupled to fluid access holes ultrasonically drilled through the ceramic package. No details are provided as to how the microfluidic connection is made between the chip and the package, nor between the package and the external fixture. Also, this scheme does not solve the problem of efficiently transitioning fluidic connections from multiple, microsized ports (e.g. 100 microns) located on the device to the larger diameter connections located on an external fixture.

Schuenemann describes a top-bottom ball grid array modular package design that combines electrical and fluidic connections in an integrated package. See M. Schuenemann, et al., "A Highly Flexible Design and Production Framework for Modularized Microelectromechanical Systems", Sensors and Actuators 73 (1999) pp. 153–168. However, Schuenemann does not disclose how to make the microfluidic connection between the chip and the package. Also, Schuenemann does not discuss the problem of efficiently transitioning fluidic connections from multiple, microsized ports (e.g. 100 microns) located on the device to the larger diameter connections located on an external fixture or supply manifold.

The need remains, therefore, for a standardized electro-microfluidic package that can be plugged into (or surface mounted onto) a fluidic printed wiring board. Fluidic printed wiring boards are standard electrical printed circuit boards that also have fluidic channels embedded inside the board. These channels carry fluid from standard connectors (e.g. 1/16 inch OD) located, for example, on the edge of the board to standardized packages or chips directly mounted on the surface of the board. Consequently, a standardized electro-microfluidic package is needed that utilizes standard electronic connections (DIP, PGA, etc.) combined with standardized, highly-reliable fluidic connections, in a small as footprint as possible, suitable for joining to a fluidic printed wiring board, for example. Against this background, the present invention was developed.

BRIEF DESCRIPTION OF THE DRAWINGS

The accompanying drawings, which are incorporate in and form part of the specification, illustrate various examples of the present invention and, together with the description, serve to explain the principles of the invention.

DETAILED DESCRIPTION OF THE INVENTION

Figure 1:
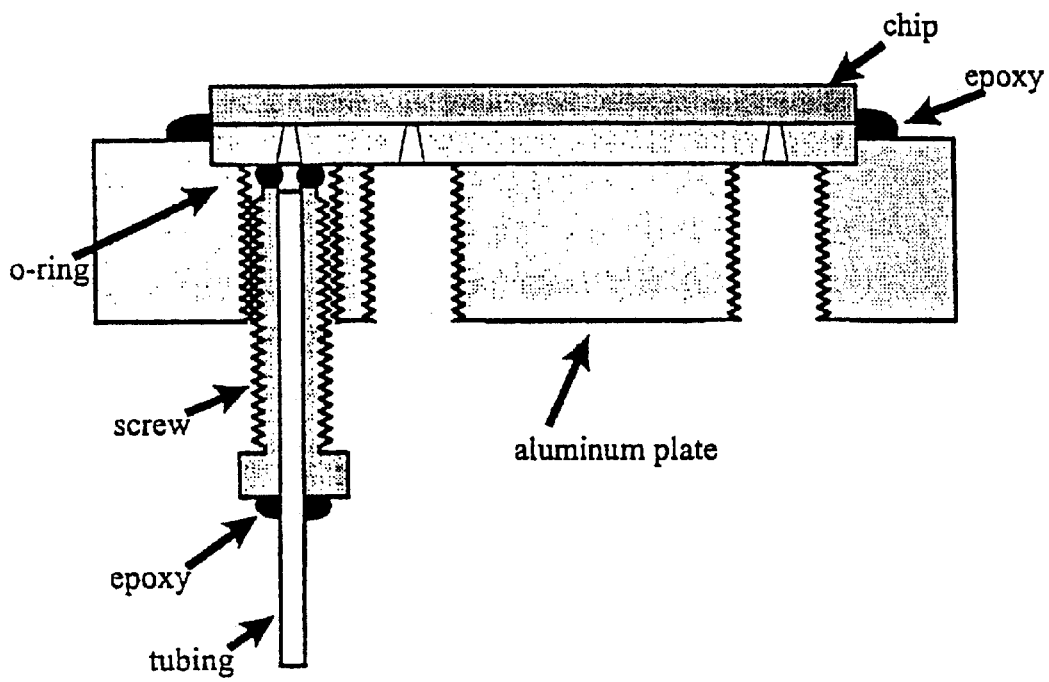
FIG. 1 (prior art) shows a microfluidic connection to a microfluidic chip made by an O-ring seal held in place by a hollow screw threaded into an aluminum plate bonded to the chip.
Figure 2:
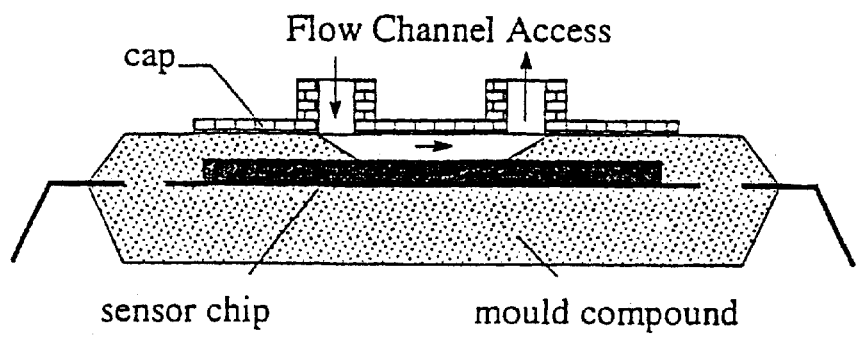
FIG. 2 (prior art) shows a packaged electro-microfluidic device molded in a plastic body having fluidic access disposed across the surface of the device, through an open window in the plastic molded body.

The goal of the present packaging architecture is to make viable fluidic and electrical connections to surface micromachined electro-microfluidic devices, and to package them in a reliable and inexpensive manner. This is a more challenging objective than that addressed by the packaging schemes described in the background section in that the size of the microfluidic channels is smaller than that used for typical bulk micromachined channels. Typically these surface micromachined microfluidic devices have channel depths on the order of 1 to 5 microns (0.00008 to 0.0002 inches), whereas bulk micromachined devices have channel depths on the order of 50 to 100 microns (0.002 to 0.004 inches)—one or two orders of magnitude larger. In addition, we envision as many as 10–20 fluid connections to a single microfluidic silicon module.

These modules are typically on the order of 5 mm by 5 mm (0.2 by 0.2 inches) in area and are approximately 50 microns (0.2 inches) thick. The volume of liquid that one can easily dispense from a very small micropipette is approximately 1 microliters, while the amount of liquid that is typically used in the shallow (2–5 micron—0.00008 to 0.0002 inch) microfluidic devices is on the order of 1 nanoliter to 1 picoliter. This large difference in scale (3 to 6 orders in magnitude in volume, 1 to 2 orders of magnitude in length) led us to consider a two-stage packaging approach. It would be difficult to go from microliter or standard SWAGELOCK connector (Swagelok, Inc., Solon, Ohio) scale (the macro-scale) to picoliter or 2 micron (0.00008 inch) scale (the surface micromachined micro-scale) in one step. Therefore our meso-scale connection can be in two stages. Alternatively, the electro-microfluidic device can be bonded directly to the fluidic printed wiring board.

Stage one can be an Electro-Microfluidic Dual Inline Package (EMDIP), to which an electro-microfluidic silicon module Microfluidic Integrated Circuit (MIC) is attached. The fluidic connection is made to the back of the MIC through Bosch-etched holes that take fluid to surface micromachined channels on the front of the MIC. The electrical connection can be made by wire bonding to bond pads on the surface of the microfluidic module. Other techniques for making the electrical connection, such as flip-chip bonding using solder bumps, can be used. The fluidic connections are made through holes in the EMDIP that coincide with holes extending through the MIC from back to front that connect to surface micromachined channels on the front of the module. In the EMDIP a fan-out and scale-up of the fluid passages can occur that is roughly one order of magnitude in length.

The EMDIP can connect to a Fluidic Printed Wiring Board (FPWB) that contains sockets for attachment of the EMDIP electrical leads, and contains fluid channels for connection to the fluid ports of the EMDIP. Standard fluidic and electronic connectors can then be used to feed fluid and power to the FPWB, and from there to the EMDIP and the MIC. The sockets in the FPWB allow for some adjustment in the engagement of the pins from the EMDIP. The EMDIP height off the FPWB surface can vary. This variation allows for the EMDIP to properly seat onto the FPWB to make leak-tight fluidic connections. O-rings, gaskets, or adhesive tape may be used at this connection (between the EMDIP and the FPWB) to aid in sealing the joint. Solder can be used to make the electrical connection.

The holes in the FPWB for microfluidic connection are approximately 0.5 mm (0.02 inches) in diameter and can be fabricated using a standard hole pattern. The holes in the EMDIP can be fabricated such that all, or only some, of the fluidic connections are used, making it possible to use the same FPWB with many different EMDIPs and MICS. This provides a flexibility similar to that provided by electrical connections where only some of the pins on a standard connector are used (e.g. DIP connectors). The EMDIP could be manufactured as a molded plastic part—just as standard plastic DIP's are.

Package for Housing an Electro-microfluidic Device

The following set of Drawings illustrates examples of various packages suitable for housing an electro-microfluidic device.

Figure 3:
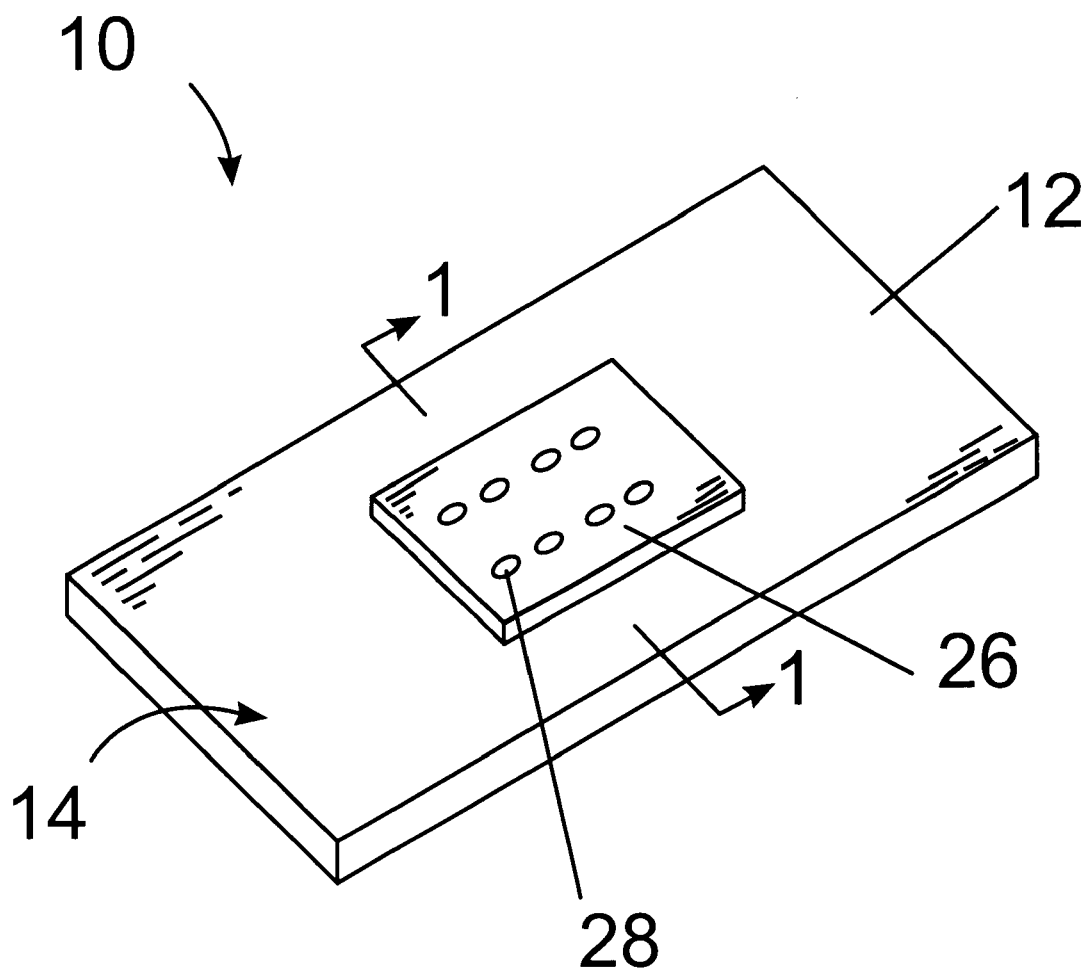
FIG. 3 illustrates a perspective view of a first example of a package for housing an electro-microfluidic device, according to the present invention.

FIG. 3 illustrates a perspective view of a first example of a package for housing an electro-microfluidic device, according to the present invention. Package 10 comprises a substantially planar substrate 12, with a first adhesive layer 26 bonded to the upper surface of substrate 12. Adhesive layer 26 has at least one fluidic accesshole 28, disposed through its thickness. Layer 26 can have a plurality of holes, arranged in either a regular or a non-regular geometric pattern. The outline or footprint of substrate 12 can have a rectangular shape. Layer 26 provides simultaneous mechanical bonding, sealing, and fluidic coupling of electro-microfluidic device 100 (not shown) to substrate 12, as will be shown later.

In the present invention, first adhesive layer 26 can be any type of adhesive material. Layer 26 can be a very thin double-sided adhesive film. The film can have a thickness of between 0.05 mm and 0.25 mm. The film can be VHB™ acrylic adhesive transfer tape, e.g. F-9460PC (50 microns thick), F-9469PC (130 microns thick), or F-9473PC (250 microns thick) manufactured by the 3M Corporation, Minneapolis, Minn. The family of VHB™ adhesive transfer tapes utilize a high performance adhesive (A-10 family) that has high tensile, shear and peel adhesion strength, excellent resistance to solvents, moisture resistance, UL recognition, low outgassing, film release liners, conformability, long shelf life, high dielectric strength, and high temperature tolerance.

There is no apparent degradation of VHB™ tapes when exposed to splash testing of many common solvents and fuels, including gasoline, JP4 jet fuel, mineral spirits, motor oil, ammonia cleaner, acetone, and methyl ethyl ketone. However, prolonged or continuous exposure to these solvents may degrade the adhesive. Integrity of the tape is expected to remain excellent after 10 years submersion in water and salt water. Short-term exposure to 260 C. for 4 hours produced no change in room temperature dynamic shear properties. Higher exposure temperatures for shorter times may be allowed, depending on the application. Typically, excellent surface contact can be attained by applying approximately 15 psi pressure to smooth, clean surfaces. Exposure to a temperature of about 60–70 C. for approximately 1 hour can improve adhesive wetout onto the mating surfaces; induce faster bonding; and increase the ultimate bond strength, in some cases. VHB™ transfer tapes adhere well to silicon and to polyetheretherketone (PEEK) plastic. VHB™ transfer tapes are typically packaged in a roll or sheet, with a releasable paper liner covering one, or both sides for protection and for ease of transferability.

The use of the phrase "adhesive tape" and "adhesive film" are considered to be interchangeable in this Specification. An adhesive transfer tape generally comprises a film of adhesive disposed in-between one or two sheets of a releasable, non-stick paper protective liner. Alternatively, the adhesive film can be applied to both sides of a polymeric carrier film (e.g. core, or backing), such as well-known "double-sticky" or "double-sided" adhesive tape. The carrier film can include a closed-cell foam layer to provide increased compliance for bonding to rough surfaces. If required, electrically conductive particles (e.g. silver) can be embedded within the adhesive material to increase thermal and electrical conductivity.

Alternatively, adhesive layer 26 can comprise a liquid film of adhesive. Electrically conductive epoxy die-attach adhesives are commonly used to attach (e.g. adhere) the silicon die to a substrate, while providing good electrical grounding. However, care must be taken not to plug up any small holes for fluidic connections due to excessive flow of liquid adhesive. Alternatively, the adhesive layer can comprise a thin film of adhesive sprayed, evaporated, or vapor deposited on to a surface (e.g. substrate 12).

The aspect ratio of the adhesive joint, defined as the ratio of the diameter of the hole (or width of the opening) divided by the thickness of the adhesive layer 26, preferably should be greater than about 0.5–1, to help prevent plugging of the hole due to excess deformation of the interior surface of layer 26, potentially caused by viscous flow, creep, or bulging from excessive bonding pressure.

Substrate 12 can comprise an electrically insulating material (e.g. a ceramic, a polymer, a plastic, a glass, a glass-ceramic composite, a glass-polymer composite, a resin material, a fiber-reinforced composite, a glass-coated metal, or a printed wiring board composition, FR-4, epoxy-glass composite, epoxy-kevlar composite, polyamide, or TEFLON. Substrate 12 can be made of Polyetherether Ketone (PEEK). The ceramic material can comprise alumina, beryllium oxide, silicon nitride, aluminum nitride, titanium nitride, titanium carbide, or silicon carbide. Fabrication of ceramic parts can be performed by processes well-known to the art (e.g. slip casting, machining in the green state, cold-isostatic pressing (CIP) followed by hot-isostatic pressing (HIP) or sintering, and uniaxially hot/cold pressing, or rapid forging). Fabrication of plastic and polymer parts can be performed by processes well known to the art (e.g. transfer molding, injection molding, and machining of printed wiring board (PWB) sheets).

Figure 4:
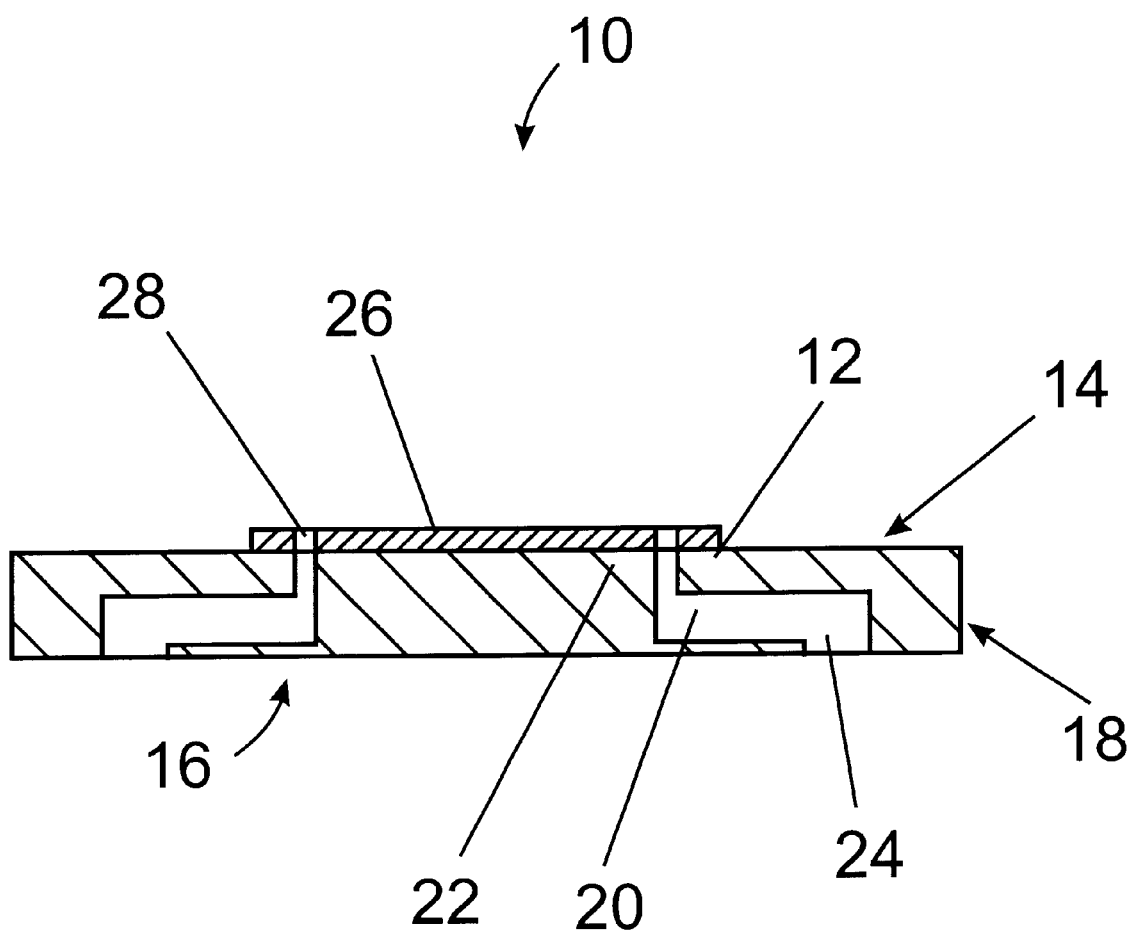
FIG. 4 illustrates cross-section view, SEC 1—1, of the first example of a package for housing an electro-microfluidic device, according to the present invention.

FIG. 4 illustrates cross-section view, SEC 1—1, of the first example of a package for housing an electro-microfluidic device, according to the present invention. Package 10 comprises a substantially planar substrate 12 having an upper surface 14, an opposing lower surface 16, and sidewalls 18. Disposed inside of substrate 12 is a first fluidic channel 20, having a first opening 22 disposed on the upper surface 14, and having a second opening 24 disposed on any surface of the substrate 12. In this first example, opening 24 is disposed on the lower surface 16. First adhesive layer 26 is bonded to the upper surface of the substrate. Layer 26 has at least one fluidic access hole 28 disposed through the layer. Hole 28 substantially aligns with, and fluidically communicates with, first opening 22. The diameter of second opening 24 can be larger than the diameter of first opening 22. The diameter of first opening 22 can be about 100 microns. The diameter of second opening 24 can be about 500 microns. The interior of fluidic channel 20 is illustrated as having right-angle corners. However, channel 20 can have smooth internal surfaces without sharp corners, depending on the method of manufacture.

Figure 5A:
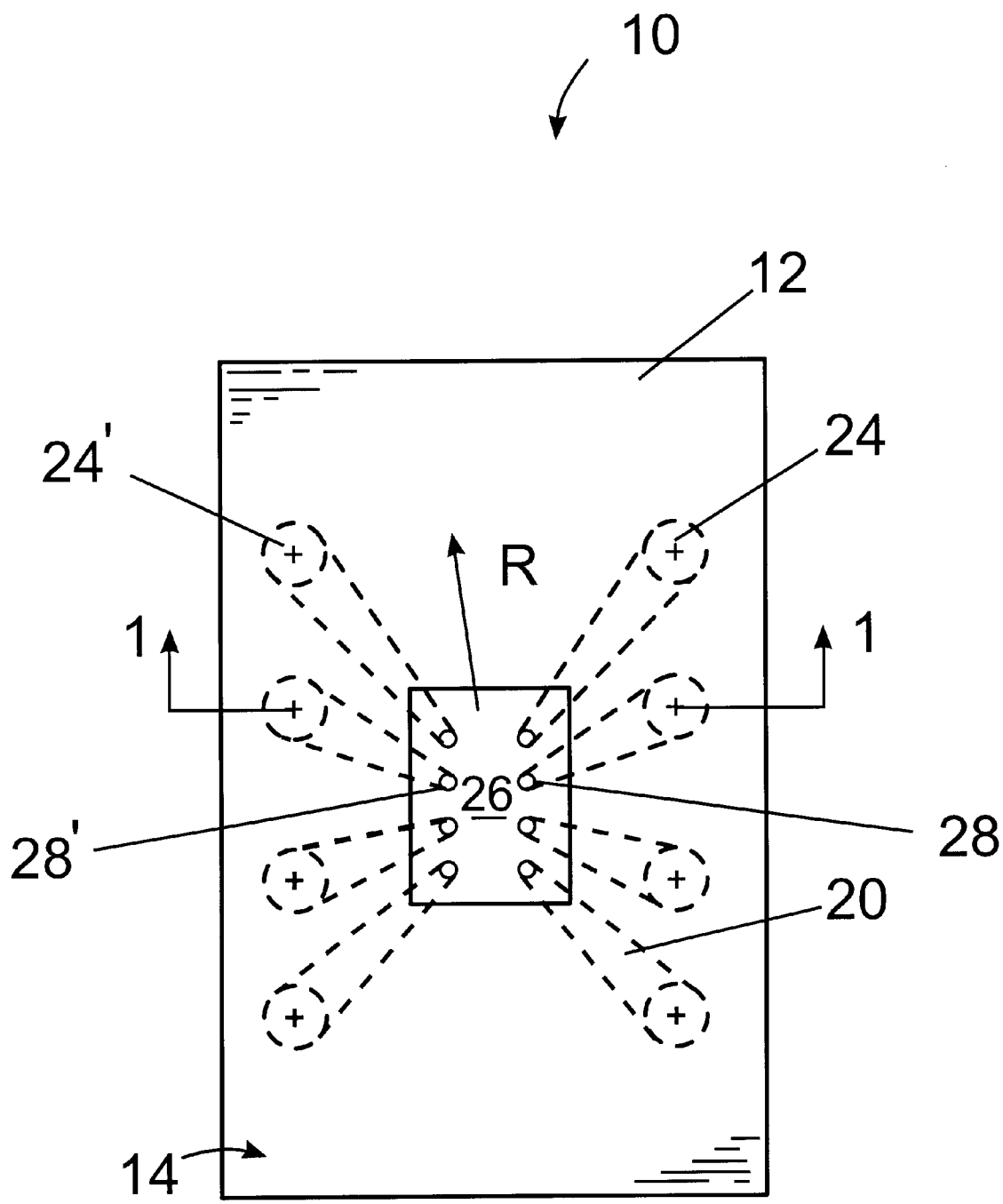
FIG. 5A illustrates a top view of the first example of a package for housing an electro-microfluidic device, according to the present invention.

FIG. 5A illustrates a top view of the first example of a package for housing an electro-microfluidic device, according to the present invention. In this example, eight fluidic channels are disposed within substrate 12, corresponding to the eight holes disposed through adhesive Layer 26. shown in FIG. 3. The width of channel 20 can be tapered, wherein the cross-sectional area of the channel increases gradually from the small first opening 22 to the large second opening 24. Additionally, the location of second opening 24 can be displaced radially outwards from the geometric centroid of first adhesive layer 26. A geometrical pattern called a "fat-out" is created when the spacing between the centers of adjacent large diameter holes (e.g. 24 and 24') is greater than the spacing between the centers of adjacent small diameter holes (e.g. 28 and 28'). The purpose of using a fan-out pattern is to spread out the grouping of small diameter holes, thereby permitting easier access to the larger diameter holes by fluidic connectors, couplers, tubing, etc.

Figure 5B:
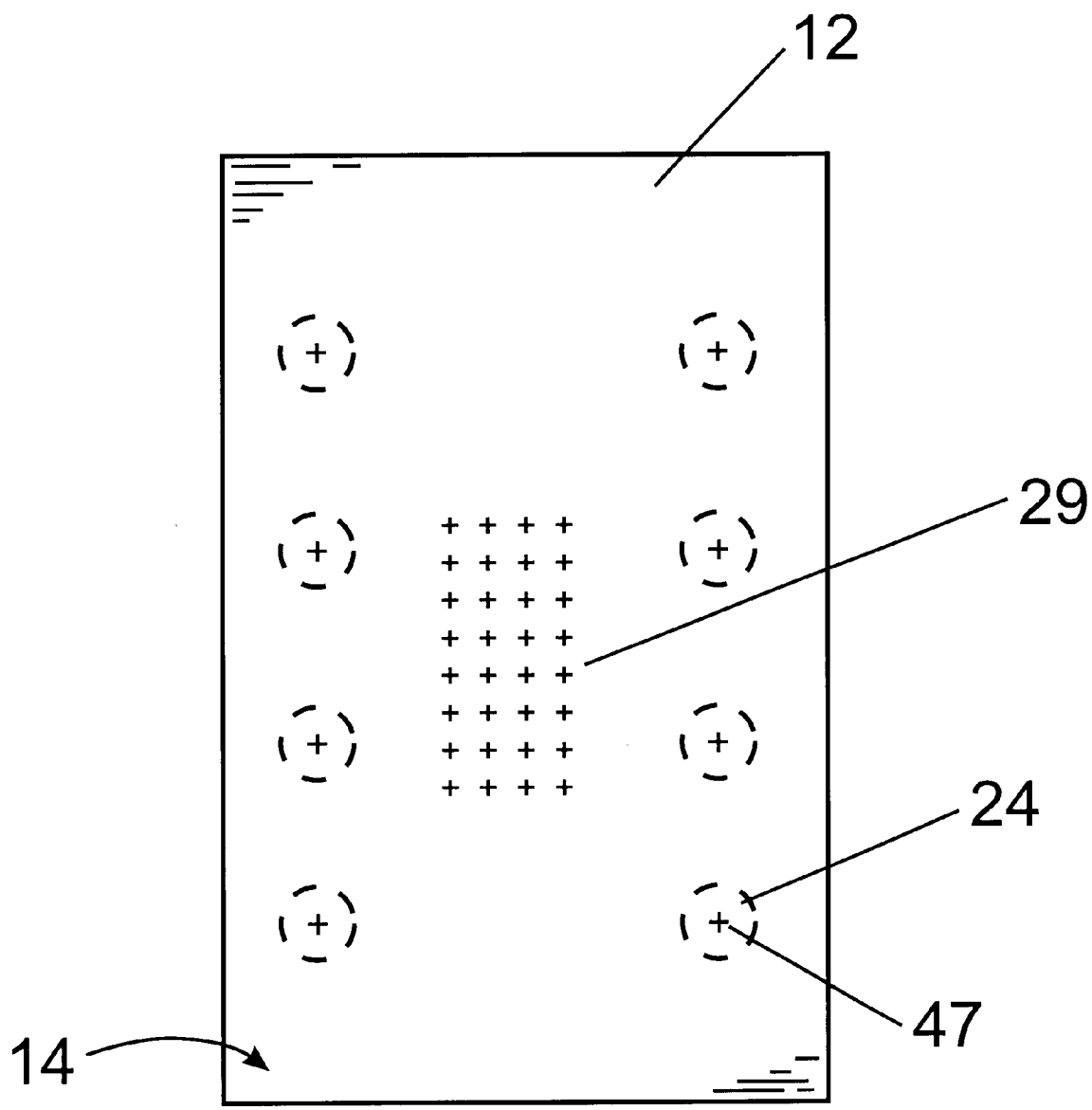
FIG. 5B illustrates a top view of a second example of a fan-out substrate, according to the present invention.

FIG. 5B illustrates a top view of a second example of a fan-out substrate, according to the present invention. Fan-out substrate 12 comprises a standardized 2×4 array of openings 24 (e.g. eight holes) on the backside 16, arranged on centerlines 47. A plurality of centerlines 29 are illustrated lying in the central region of substrate 12 and located on the upper surface 14. Centerlines 29 can be arranged in a 4×8 array (total of 32 centerlines), and are disposed directly underneath the footprint (e.g. outline) of electro-microfluidic device 100 (not shown). These centerlines 29 are not actually marked onto substrate 12, but, rather, indicate allowable locations (e.g. allowable centerlines) that could be used for matching up with a smaller subset of the smaller-diameter holes 28. The number of independent holes in the smaller subset typically would not exceed the number of corresponding larger-diameter holes 24 on the backside of substrate 12. In this second example, the smaller subset of holes 28 would not exceed eight. However, the location of the eight holes 28 could be chosen by the designer of electro-microfluidic device 100 to align with any eight of the possible thirty-two locations indicated by the 4×8 array of centerlines 29 in FIG. 5B.

Figure 5C:
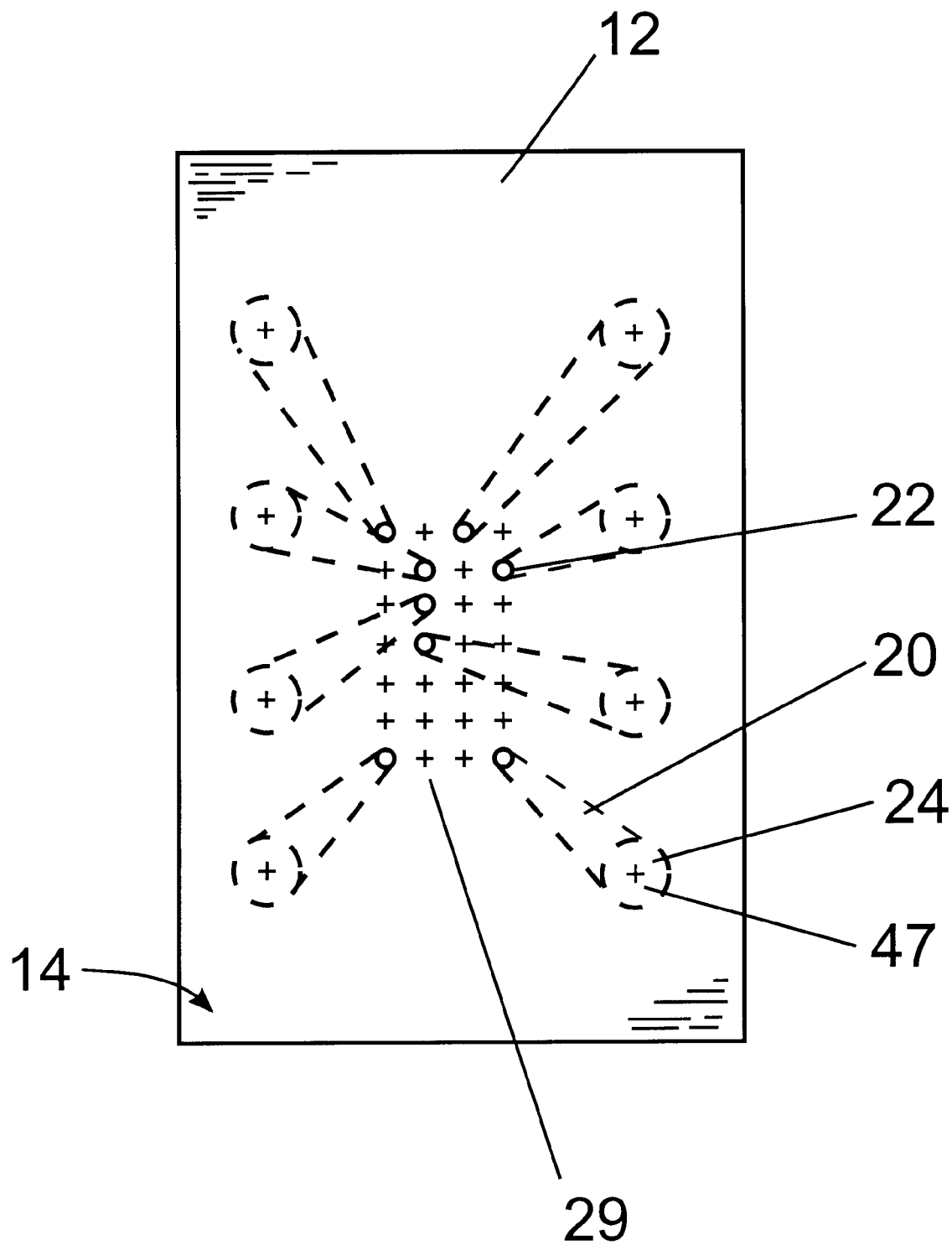
FIG. 5C illustrates a top view of a third example of a fan-out substrate, according to the present invention.

FIG. 5C illustrates a top view of a third example of a fan-out substrate, according to the present invention. In this example, eight holes 22 have been drilled through upper surface 14 of substrate 12, penetrating into fluidic channels 20 below. The positions of holes 22 were selected to align with the 4×8 array of allowable centerlines 29, and to meet the needs of electro-microfluidic device 100. Disposed inside of substrate 12 are internal fluidic channels 20 connecting hole 22 with second opening 24, located on centerline 47. Fluidic channels 20 are shown as having a tapered cross-section, arranged in a fan-out pattern. In a different design of device 100 having a different layout of the corresponding eight (or less) holes 22, a different substrate 12 having a customized fan-out pattern would be required. Even in this case, however, the layout of second opening holes 24 on centerlines 47 would remain the same because this layout, preferably, conforms to a standard pattern (e.g. standardized).

Figure 6:
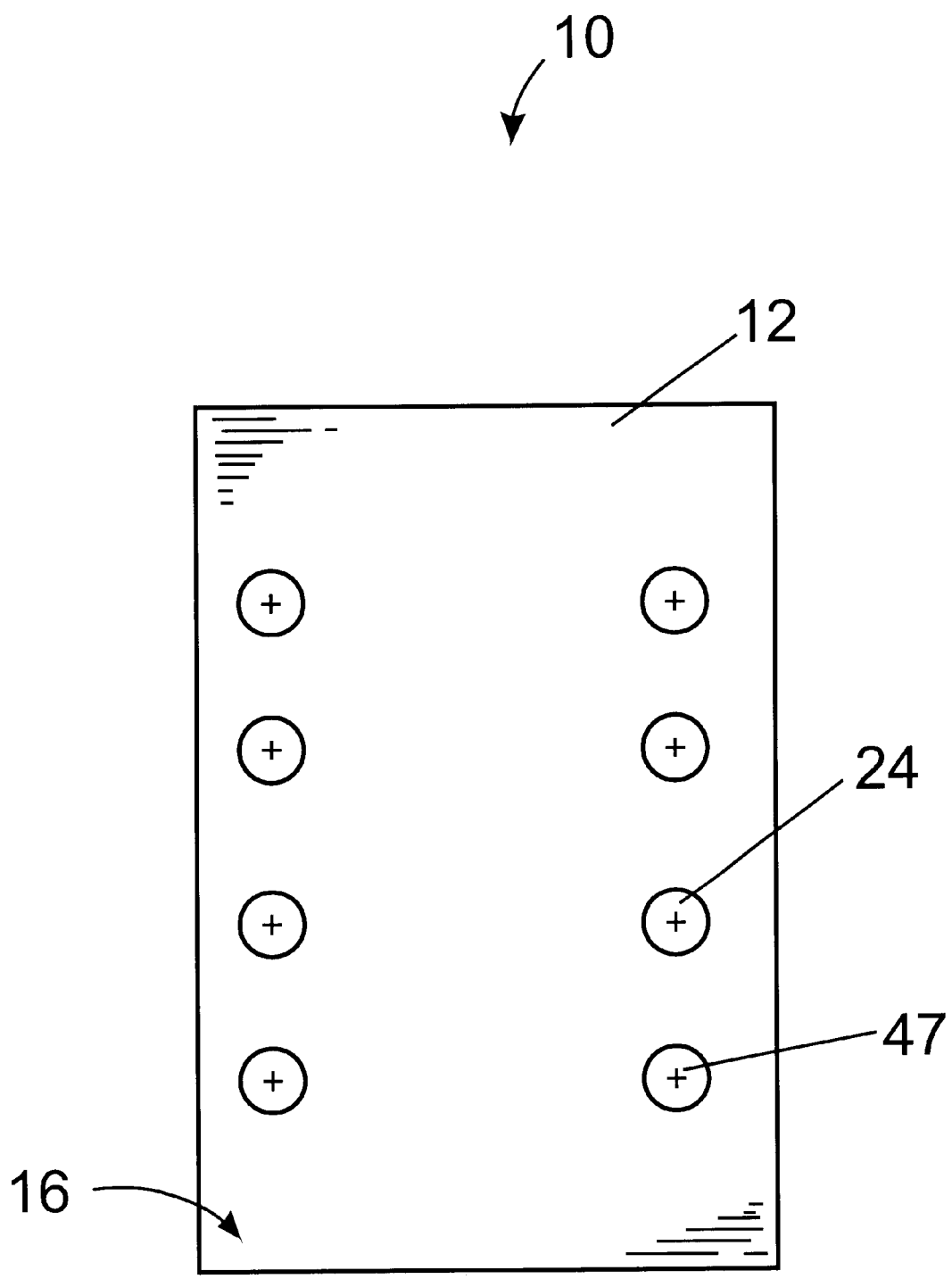
FIG. 6 illustrates a bottom view of the fourth example of a package for housing an electro-microfluidic device, according to the present invention.

FIG. 6 illustrates a bottom view of the fourth example of a package for housing an electro-microfluidic device, according to the present invention. Eight holes 24 are arranged in a regular array having two parallel rows, with four holes in each row, spaced uniformly apart. Holes 24 can be approximately 100 microns, and the spacing between holes 24 can be approximately 1 mm. The geometrical arrangement of holes 24 can be selected advantageously to match a standardized pattern, as will be discussed later.

Figure 7:
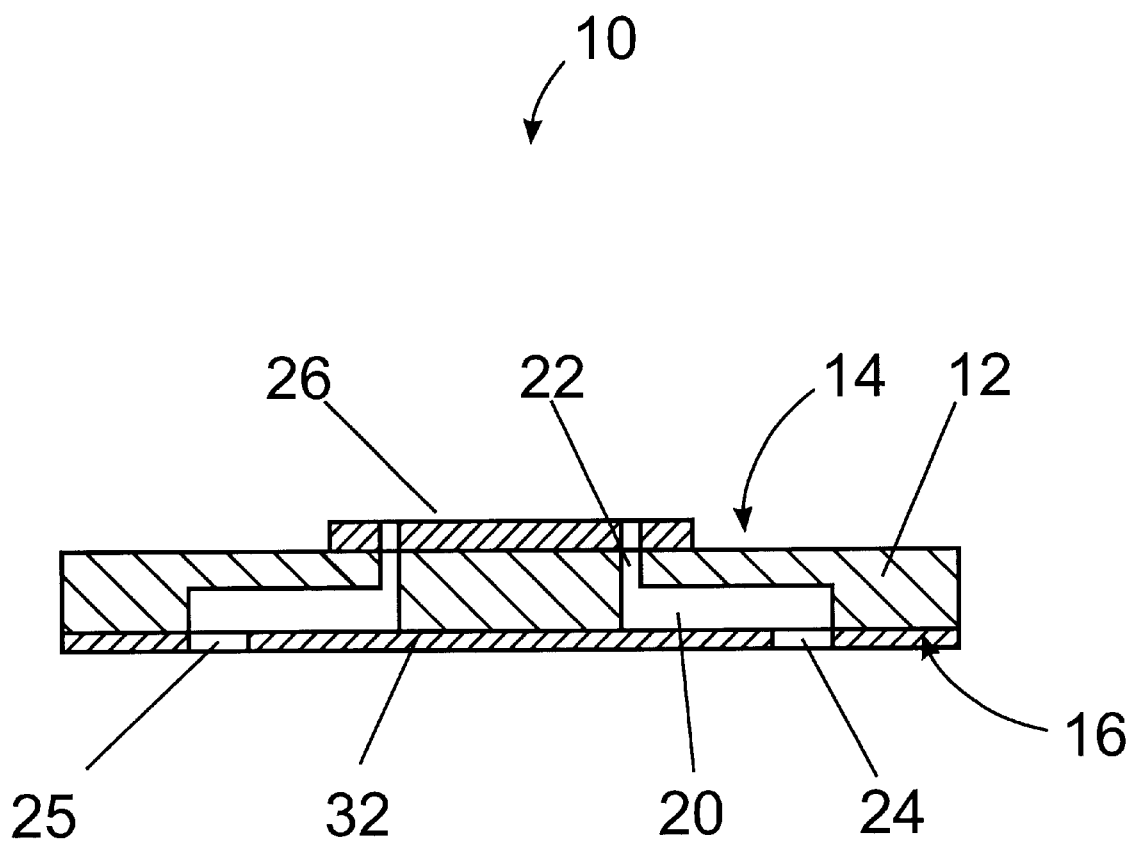
FIG. 7 illustrates a cross-section view, SEC 1—1, of a fifth example of a package for housing an electro-microfluidic device, according to the present invention.

FIG. 7 illustrates a cross-section view of a fifth example of a package for housing an electro-microfluidic device, according to the present invention. Fluidic channel 20 can comprise an open trench (not numbered), wherein the open side of the trench is coplanar with the lower surface 16 of substrate 12. The trench can be fabricated by machining (e.g. milling), molding, ablating, or chemically etching a recessed cavity or feature into the solid surface 16 of substrate 12. The open trench of channel 20 can be covered by a closeout plate 32, which is attached to lower surface 16. Closeout plate can have a hole 25 disposed through its thickness, which aligns closely with the second fluidic opening 24. In this example, the bottom view of closeout plate 32 matches the hole pattern shown previously in FIG. 6. Closeout plate 32 can be made of the same material as substrate 12 (e.g. plastic, ceramic, etc.), and can be bonded to surface 16 by any well-known method, including using a liquid adhesive, an adhesive film or tape, a thermal bond, a solder joint, a braze joint, an anodic bond (e.g. between silicon and glass), a glass-frit bond, a diffusion bond, or a chemical bond. Preferably, closeout plate 32 comprises a rigid material. Closeout plate 32 can be molded into place.

Alternatively, closeout plate 32 in FIG. 7 can be made of a flexible pressure-sensitive adhesive film (e.g. VHB™ adhesive transfer tape).

Figure 8A:
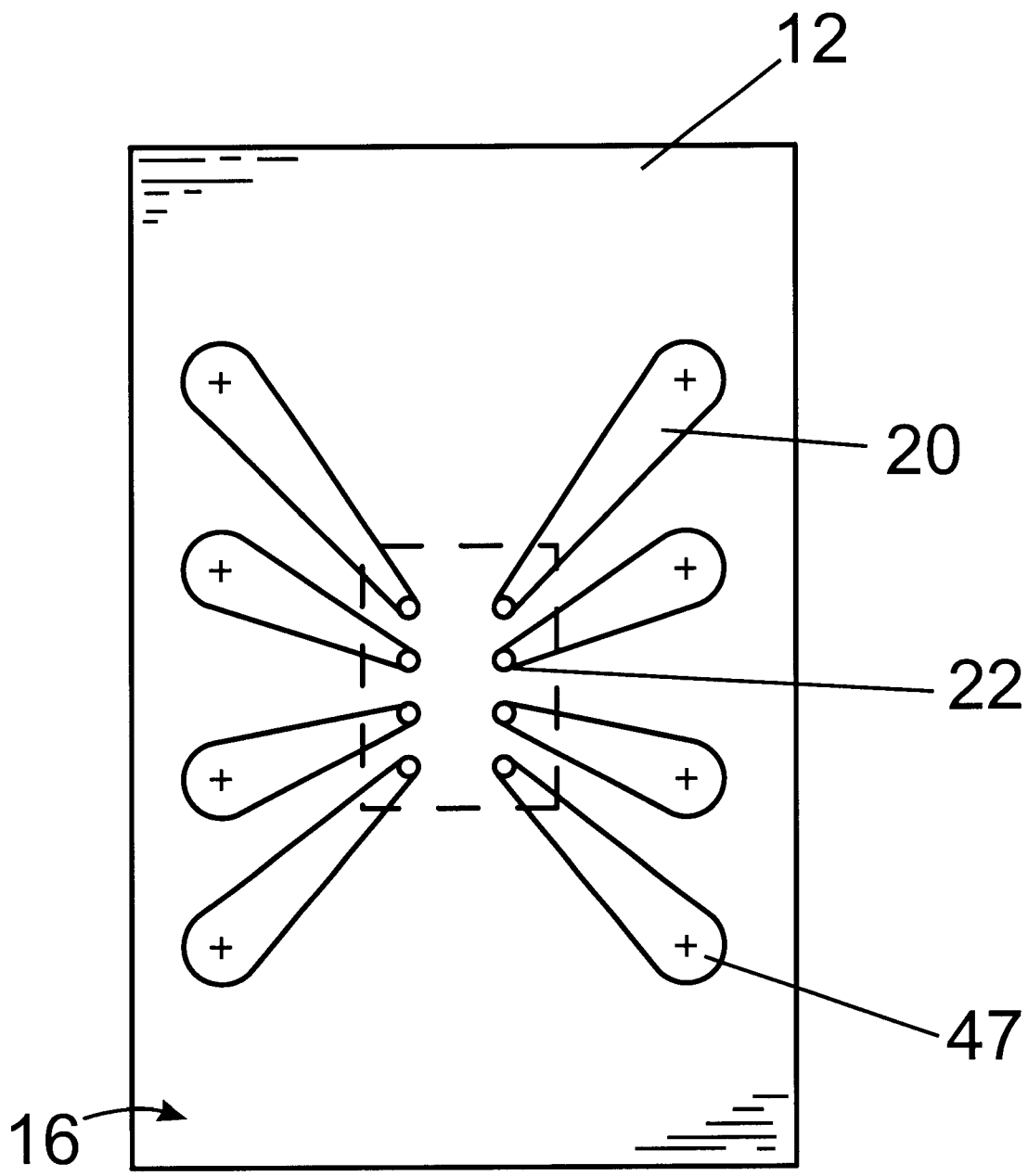
FIGS. 8A illustrates a bottom view of a sixth example of a substrate, with the closeout plate removed, according to the present invention.

FIGS. 8A illustrates a bottom view of a sixth example of substrate 12 (illustrated previously in FIG. 7), with closeout plate 32 removed for the sake of clarity, according to the present invention. Lower surface 16 of substrate 12 has eight open trenches 20 arranged in a tapered, fan-out pattern. First fluidic opening 22 penetrates through substrate 12 at the narrow end of open trench 20. At the large end of open trench 20, centerline 47 coincides with second fluidic opening 24. The outline (e.g. footprint) of adhesive layer 26 on opposing surface 14 is illustrated as a dashed line. In this sixth example, the locations of holes 22 are arranged in a 2×4 regular array.

Figure 8B:
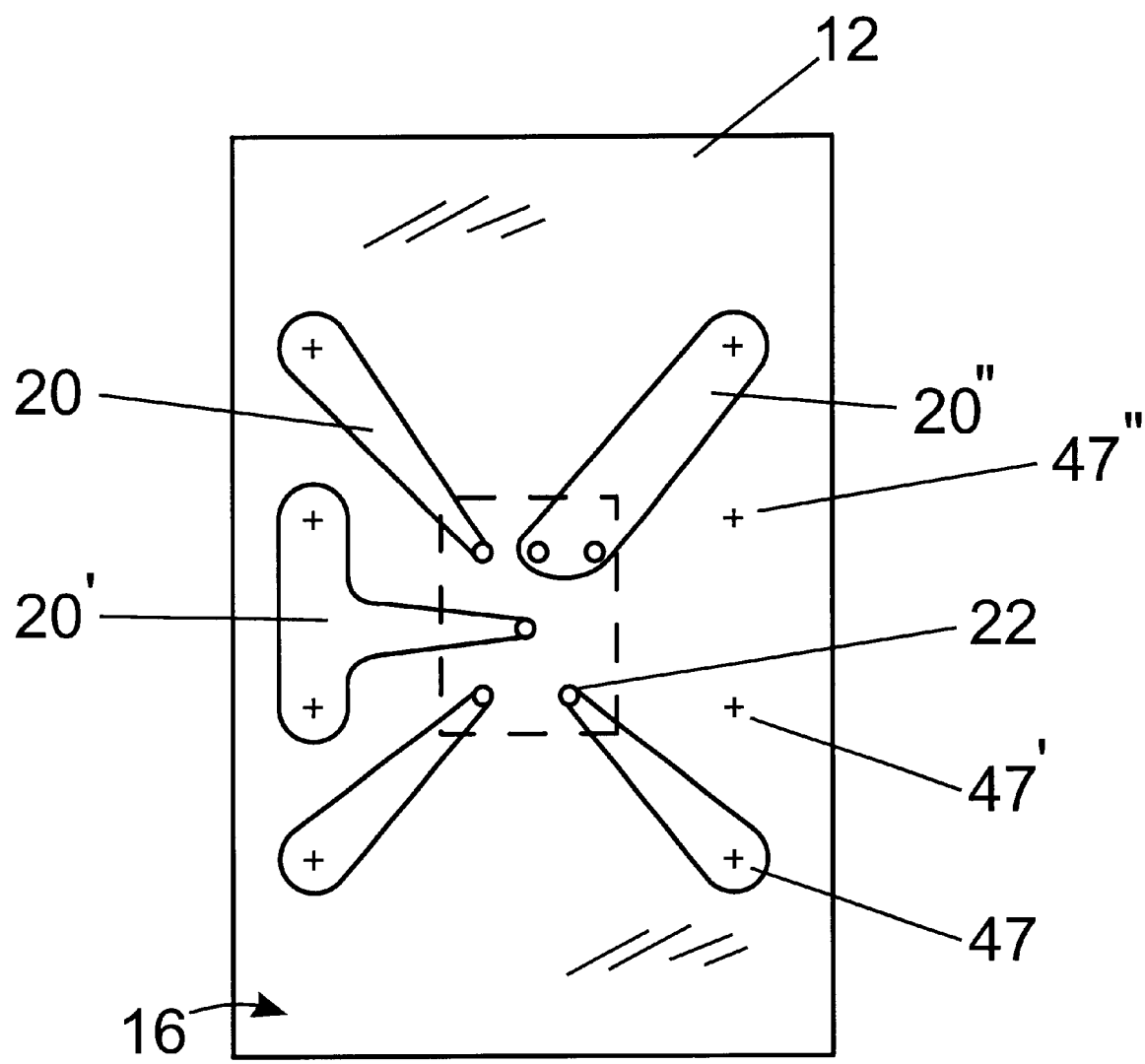
FIGS. 8B illustrates a bottom view of a seventh example of a substrate, with the closeout plate removed, according to the present invention.

In the seventh example shown in FIG. 8B, the set of holes 22 are not arranged in a regular pattern. Rather, the pattern of holes is selected to meet the needs of the mating electro-microfluidic device (not shown). However, the location of holes 22 can be selected to match up with the allowable centerlines illustrated previously in FIG. 5B. FIG. 8B shows other variations in the manifolding of channels 20. In this seventh example, centerline's 47' and 47" are not selected to be used as a fluidic connection. Also, channel 20' has a common manifold, which provides a common supply of fluid or gas from multiple openings 24 to a single hole 22. Alternatively, channel 20" has a common manifold, which provides a common supply from two small holes 22 to a single large opening 47. It should be apparent to one skilled in the art that the complexity of fluidic channels 20 is only limited by the capability to manufacture open trenches having complex shapes in substrate 12.

In both FIGS. 8A and 8B, the centerlines 47 were located on a standardized pattern, which is useful for mating to an external fixture having the same standardized pattern.

Figure 9:
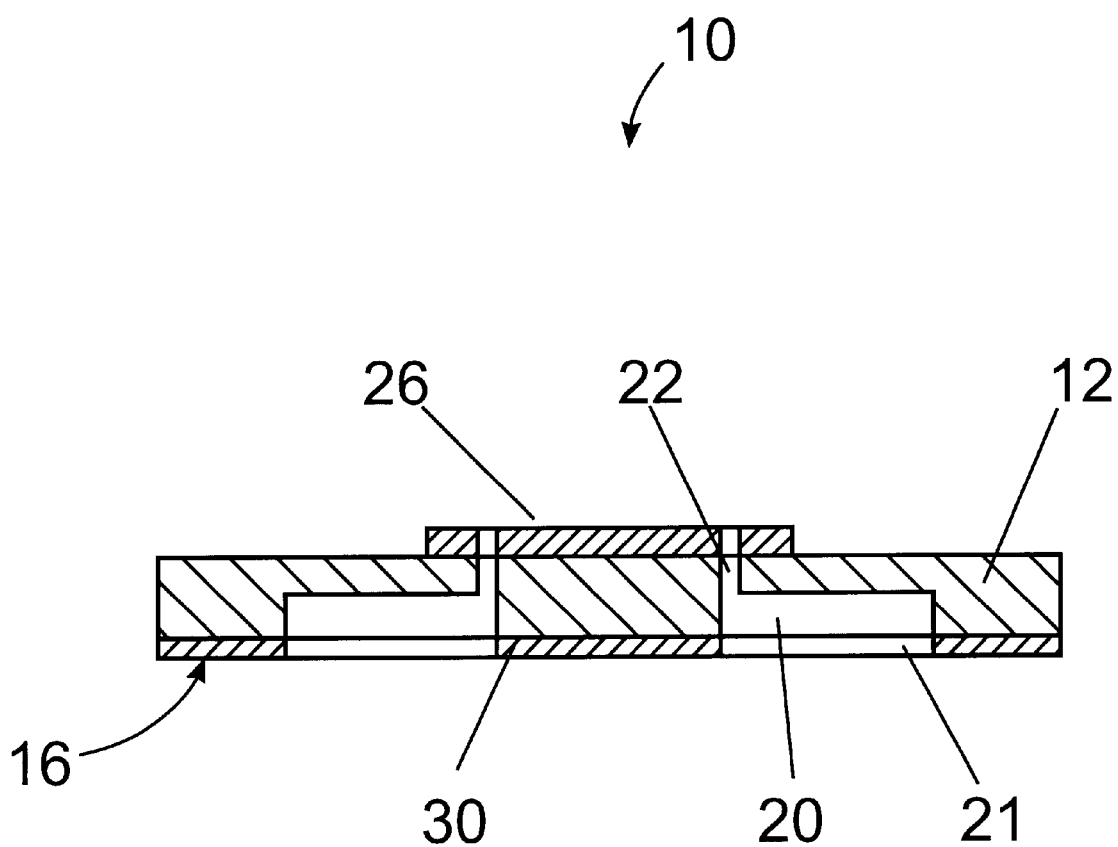
FIG. 9 illustrates a cross-section view, SEC 1—1, of an eighth example of a package for housing an electro-microfluidic device, according to the present invention.

FIG. 9 illustrates a cross-section view, SEC 1—1, of an eighth example of a package for housing an electro-microfluidic device, according to the present invention. Fluidic channel 20 comprises an open trench, where the open side of the trench is coplanar with the lower surface 16 of substrate 12. The open trench of channel 20 can be covered by closeout plate 30, which is attached to lower surface 16. Closeout plate 30 comprises a penetration 21 disposed through its thickness. The shape (i.e. outline) of penetration 21 matches substantially the outline of trench 20, which generally has a tapered shape.

Figure 10:
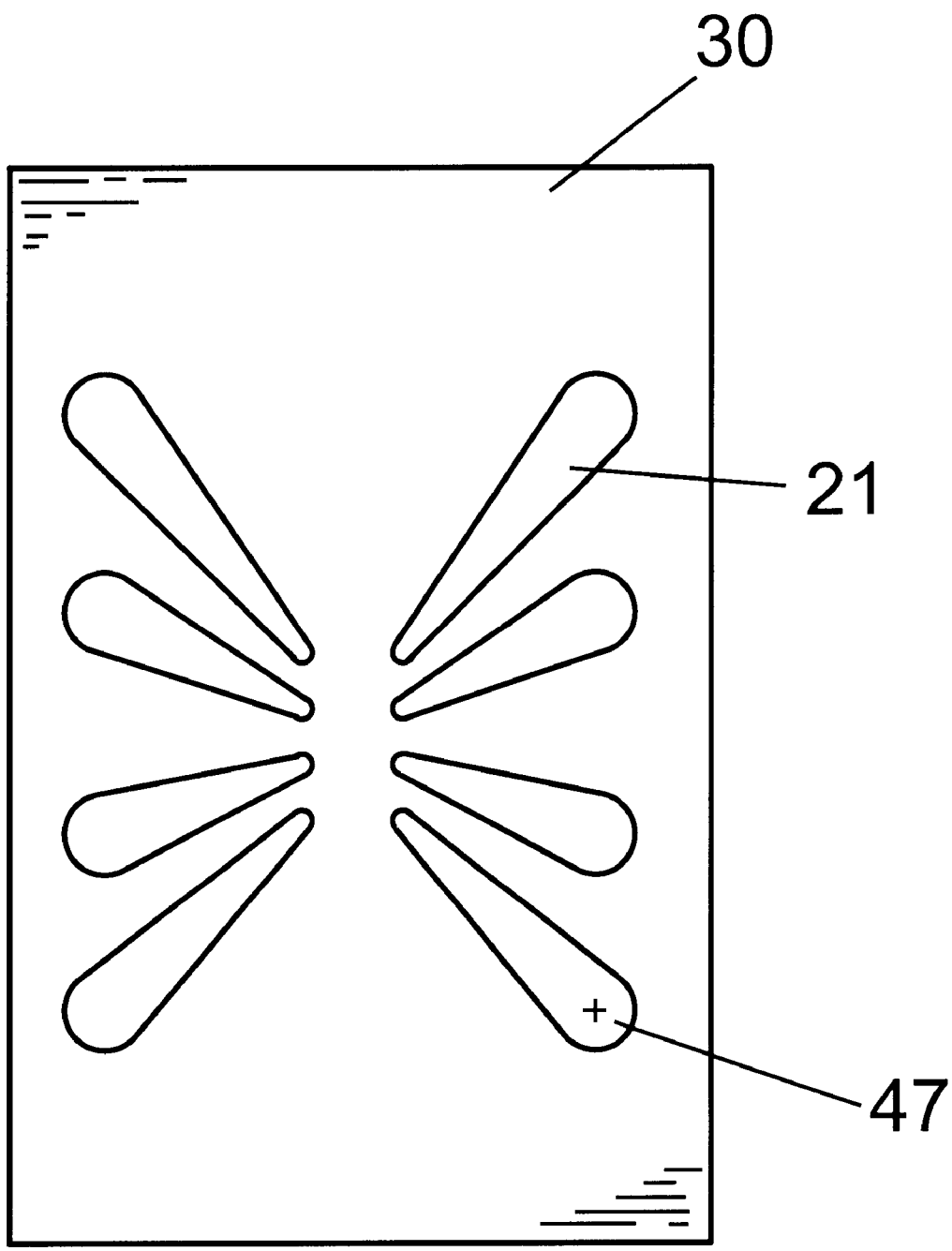
FIG. 10 illustrates a bottom view of a ninth example of a closeout plate according to the present invention.

FIG. 10 illustrates a bottom view of a ninth example of closeout plate 30, according to the present invention. The shape of penetration 21 closely matches the fan-out pattern of substrate 12 having tapered channels 20, as illustrated previously in FIG. 8A. This arrangement is preferred for the present invention when the closeout plate 30 is made from a very thin adhesive film because both sides of the adhesive film are disposed in-between two solid surfaces. This arrangement allows positive pressure to be applied to a pressure-sensitive adhesive film, thereby providing uniform and satisfactory adhesion.

Packaged Electro-Microfluidic Device

The following set of Drawings illustrates examples of an electro-microfluidic device housed in a package.

Figure 11:
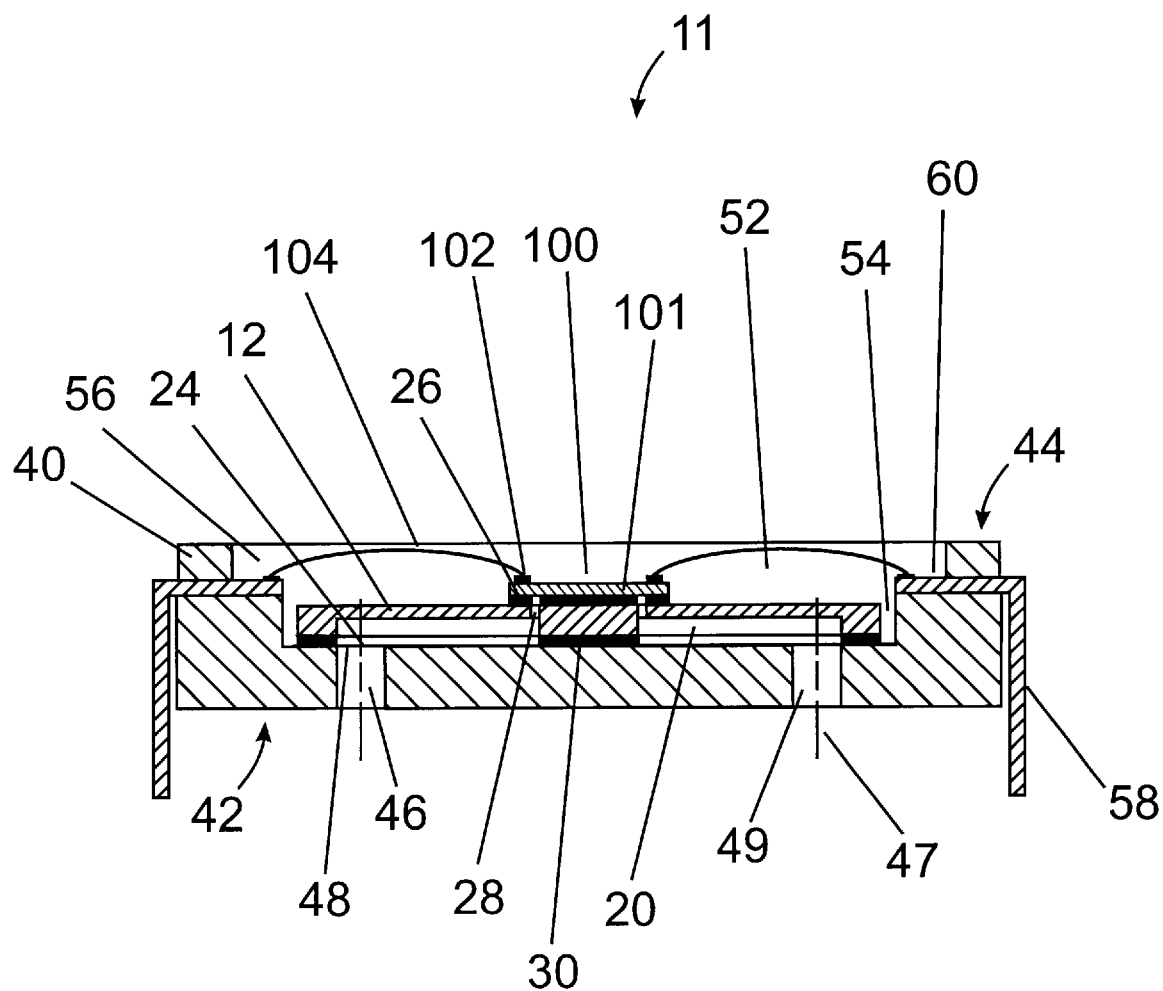
FIG. 11 illustrates a cross-section view of a tenth example of a packaged electro-microfluidic device, according to the present invention.

FIG. 11 illustrates a cross-section view of a tenth example of a packaged electro-microfluidic device, according to the present invention. Electro-microfluidic device 100 is attached to first adhesive layer 26. Layer 26 provides simultaneous mechanical bonding, sealing, and fluidic coupling of the device 100 to substrate 12

Electro-microfluidic device 100 can comprise both active electrical and fluidic elements. Fluids processed by device 100 can be liquid, gaseous, or a combination of both. The fluid can include particles (e.g. blood cells) dispersed in a fluid. Device 100 can be made of silicon, and can include active electronic elements manufactured by conventional semiconductor IC technology (e.g. CMOS). Device 100 can include surface micromachined Micro-Electro-Mechanical-Systems (MEMS) elements, and can include microfluidic elements (e.g. micro-valves, micro-flow sensors, microheaters, micro-electrophoresis channels, chemical sensors, DNA analyzers, etc.). Device 100 can comprise inlet and outlet fluidic ports 101 (not illustrated) for applying and removing fluids. The diameter of these fluidic ports can be about 100 microns, and the ports can be spaced about 1 mm apart. A Bosch etch process can be used to etch through the silicon wafer from the backside. The Bosch etch stops on the bottom layer of sacrificial oxide deposited on the front surface of the device. Cuts through the bottom layer of insulating Silicon Nitride are used to define the Bosch etch entrance/exit (e.g. access) ports. Access ports can have diameters as small as 10 microns using this process. Sacrificial silicon dioxide is used to define microfluidic channels in device 100 with channel depths of approximately 1–5 microns, which are opened up by a release etch, which removes all of the sacrificial oxide between layers of polysilicon.

The outline or footprint of device 100 can be rectangular or square, having typical dimensions of 3 mm×6 mm, or 5 mm×5 mm. Device 100 can include electrical bonding pads 102. Pads 102 can be disposed on the opposite side from fluidic ports 101. Fluidic inlet/outlet ports 101 can be located on either side of device 100. Device 100 can be electrically interconnected to package 11 by wirebonds 104, or other well-known interconnection schemes.

Referring still to FIG. 11, device 100 is attached to substrate 12 via adhesive gasket 26. Fluidic access hole 28 in adhesive gasket 26 fluidically couples the device's fluidic port 101 to fluidic channel 20, disposed inside of fan-out substrate 12. Gasket 26 simultaneously provides strong mechanical bonding and leak-tight fluidic coupling between device 100 and substrate 12. Substrate 12 is attached to a supporting base 40 with a second adhesive layer 30. Adhesive layer 30 can have a cutout pattern that closely matches the fan-out pattern of open trenches 20 in substrate 12. Base 40 can include a second fluidic channel 46, which provides fluidic access to channel 20 from the bottom surface 42 of base 40. In this example, second fluidic opening 24 of substrate 12 aligns with, and fluidically couples to, a third fluidic opening 48 disposed on the upper surface of base 40. Second fluidic channel 46 comprises a fourth fluidic opening 49 disposed on the bottom surface 42 of base 40. The diameter of opening 49 can be larger than the diameter of opening 48. However, in FIG. 11, the diameters of openings 48 and 49 are illustrated as being substantially the same.

Referring still to FIG. 11, base 40 includes a recessed cavity 52, which has a lower cavity surface (not numbered); an intermediate ledge 60; and a top surface 44. The third fluidic opening 48 is disposed on the lower cavity surface. A gap 54 exists in-between the outside sidewalls 18 of substrate 12 and the interior wall (not numbered) of cavity 52. Gap 54 can be filled with a sealant material to protect adhesive gasket 30 from solvent attack, etc. Recessed cavity 52 can provide close mechanical alignment for aligning substrate 12 with openings 48 in base 40. In this case, gap 54 should be made as small as possible to provide good alignment with a tight tolerance.

Referring still to FIG. 11, base 40 comprises an electrical bonding location 56 disposed on ledge 60. Bonding location 56 can include gold bonding pads (not shown). Base 40 can further comprise means for electrically connecting bonding location 56 to an external fixture (not shown). The means for electrical connection can include one or more electrical leads 58. Leads 58 can comprise copper alloy leads that are at least partially embedded within base 40. Device 100 with bonding pads 102 can be electrically wirebonded with wirebonds 104 bonding location 56 on lead 58. Electrical leads 58 can be arranged in a standardized pattern, i.e. a Dual-In-Line-Package (DIP), etc.

Referring still to FIG. 11, the combination of base 40, using leads 58 arranged in a DIP pattern, with fan-out substrate 12 attached to base 40 using adhesive layer 30, can be described as an Electro-Microfluidic Dual Inline Package (EMDIP). Base 40 can be made of a molded plastic material, with leads 58 being bent downward after removing base 40 from the two-part mold forms. Cavity 52 can be optionally filled with a poured-in liquid encapsulant (e.g. epoxy) which surrounds and protects wirebonds 104 in a hardened plastic material (not shown). A cover lid (not shown) can be optionally attached to upper surface 44.

Figure 12A:
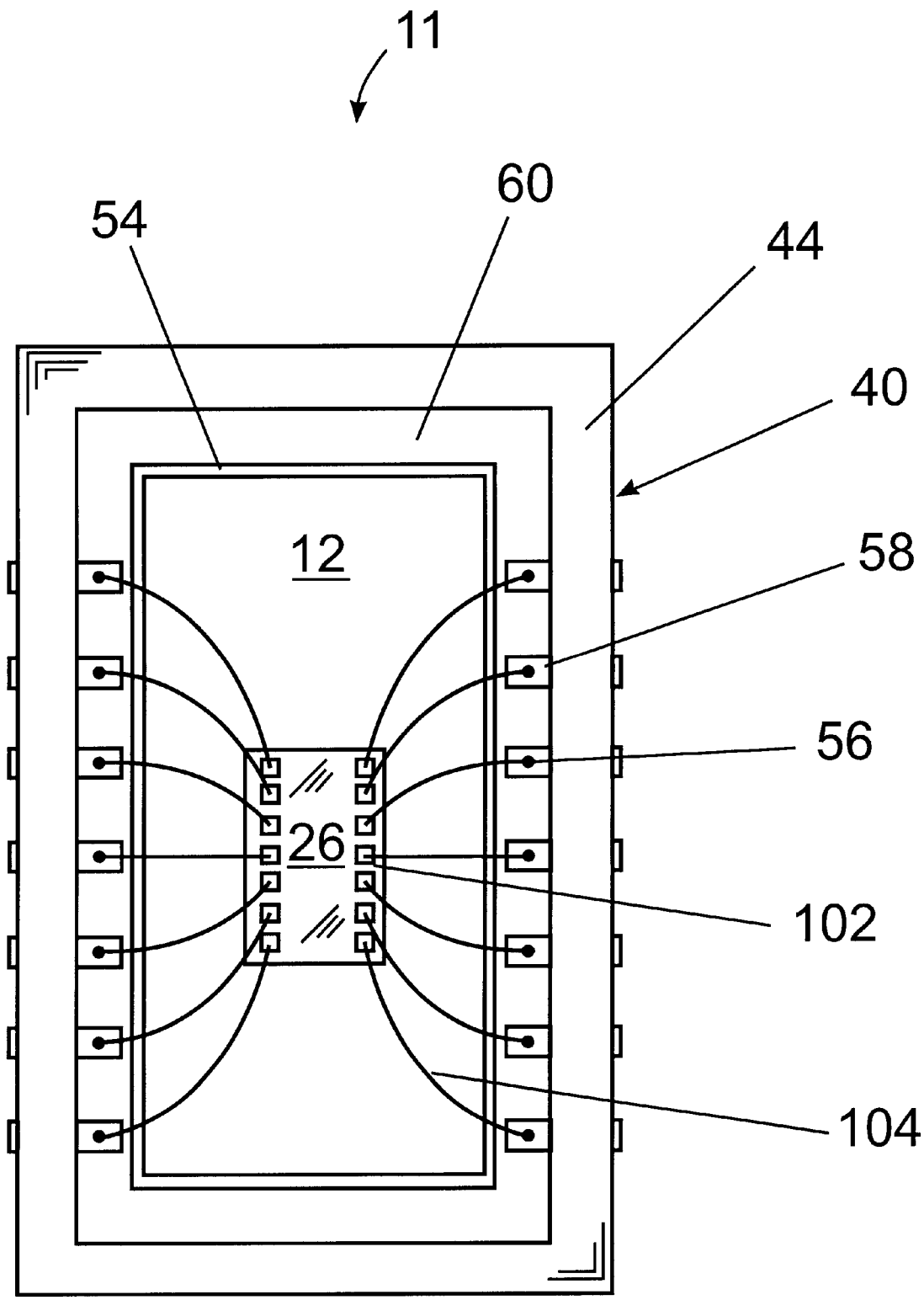
FIG. 12A illustrates a top view, of an eleventh example of a packaged electro-microfluidic device shown in FIG. 11, according to the present invention.

FIG. 12A illustrates a top view of the eleventh example of a packaged electro-microfuidic device shown in FIG. 11, according to the present invention. Base 40 can have a rectangular shape, with a rectangular recessed cavity 52 that houses substrate 12. Exposed ends of electrical leads 58 can be arranged on ledge 60 in two parallel rows along the long direction of base 40, which minimizes the length of wirebonds 104.

Figure 12B:
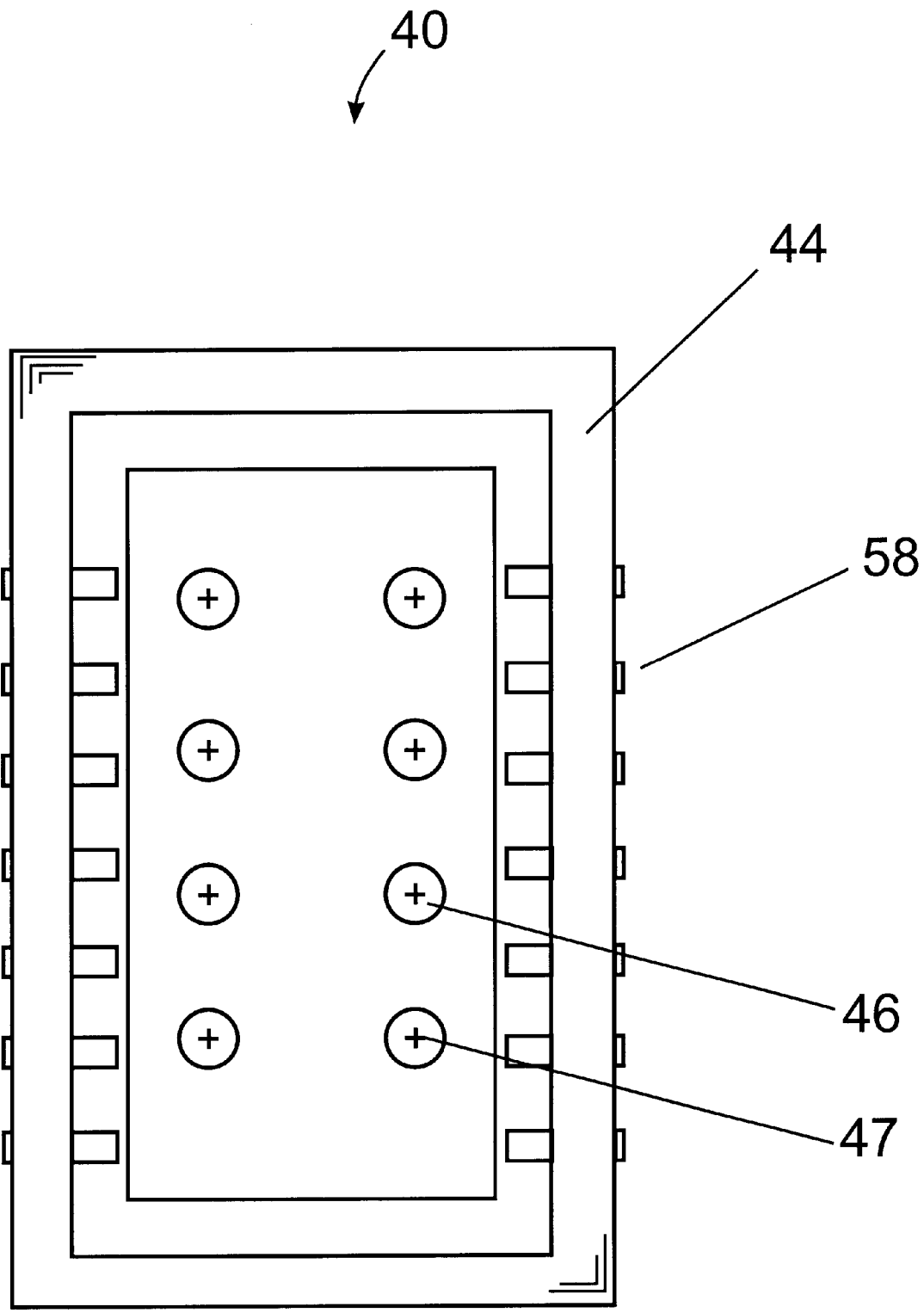
FIG. 12B illustrates a top view of a twelfth example of a standardized pattern of fluidic connections on the base, according to the present invention.

FIG. 12B illustrates a top view of a twelfth example of a package for housing an electro-microfluidic device, according to the present invention. In this example, substrate 12 has been removed for the sake of clarity, and only base 40 is shown. Base 40 has two parallel rows of fluid connections, each row having four holes 46, providing a standardized 2×4 array of holes. Substrate 12 (not shown) may utilize all eight holes 46, of a subset thereof. This design is similar to the concept of having standardized electrical connections for standardized packages (e.g. DIP, SIP, Quad Flat-Pack, etc.). The present invention can comprise a standardized set of fluidic connections in addition to standardized electrical connections. The external fixture (e.g. fluidic printed wiring board) can have the same pattern (e.g. geometry) of fluidic connection holes as exists on the bottom surface of base 40 or package 11. However, some of the fluidic connections might not be used, depending on the application.

Figure 13:
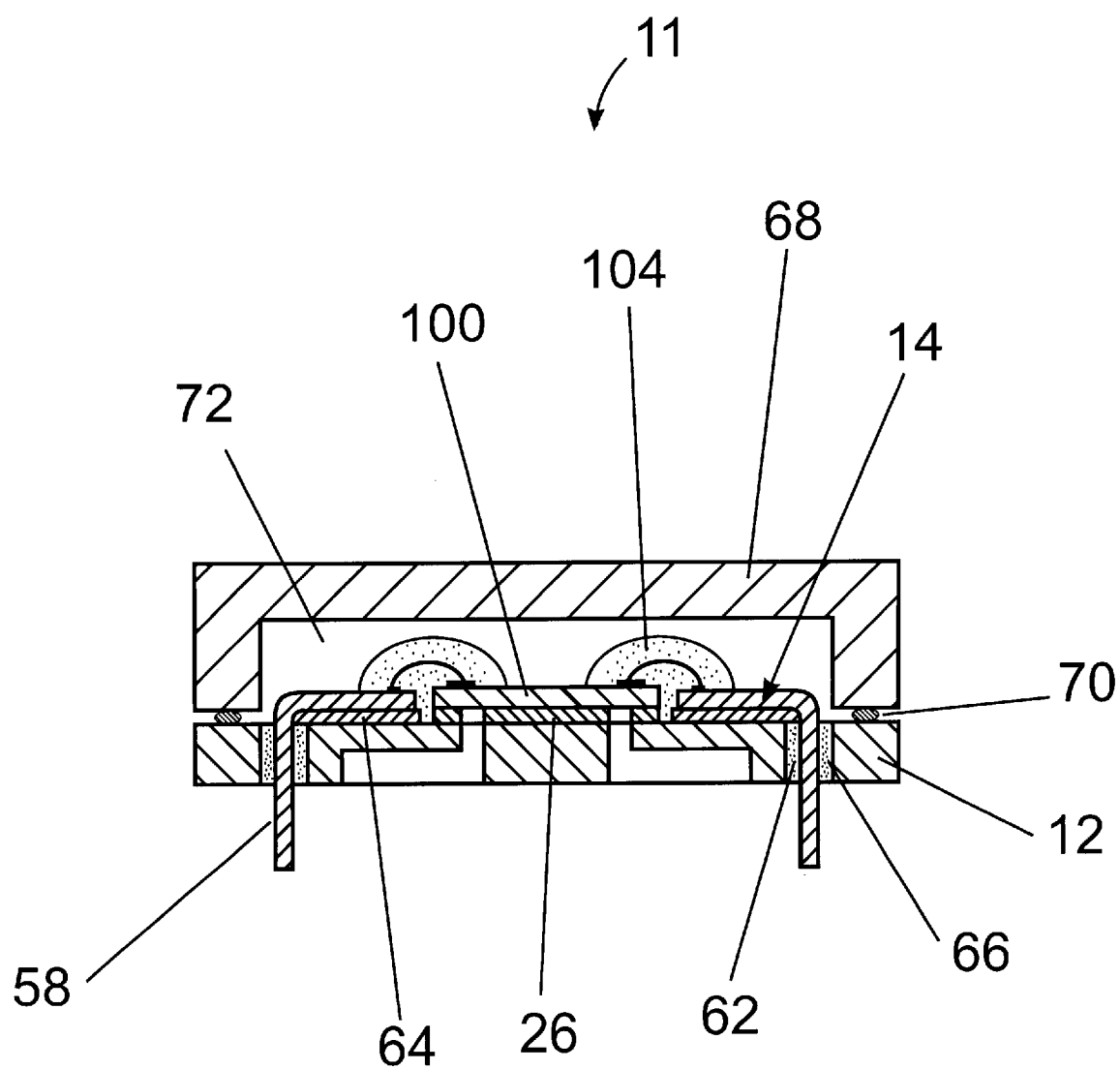
FIG. 13 illustrates a cross-section view of a thirteenth example of a packaged electro-microfluidic device, according to the present invention.

FIG. 13 illustrates a cross-section view of a thirteenth example of a packaged electro-microfluidic device, according to the present invention. In this example, electrical connection leads 58 are attached to the upper surface 14 of substrate 12 with an adhesive layer 64. Layer 64 can comprise VHB acrylic adhesive transfer tape or another adhesive film commonly used in Tape Automated Bonding (TAB) packaging of IC's. Alternatively, layer 64 and adhesive gasket 26 can both be part of the same piece of adhesive film. The protruding ends of leads 58 pass through open hole 62, which is disposed through the thickness of substrate 12. Open hole 62 can be filled with an epoxy sealant 66, which can provide additional mechanical support for leads 58. Package 11 can further comprise a cover 68 attached to the upper surface 14 of substrate 12. Cover 68 can be attached with an organic, solder, glass-frit, or braze sealring 70. Wirebonds 104 can be encapsulated with a glob-top epoxy encapsulant 72, prior to attaching cover 68. Glob-top epoxy 72 can also be injected into the open space in-between adhesive gasket 26 and adhesive layer 64.

Figure 14:
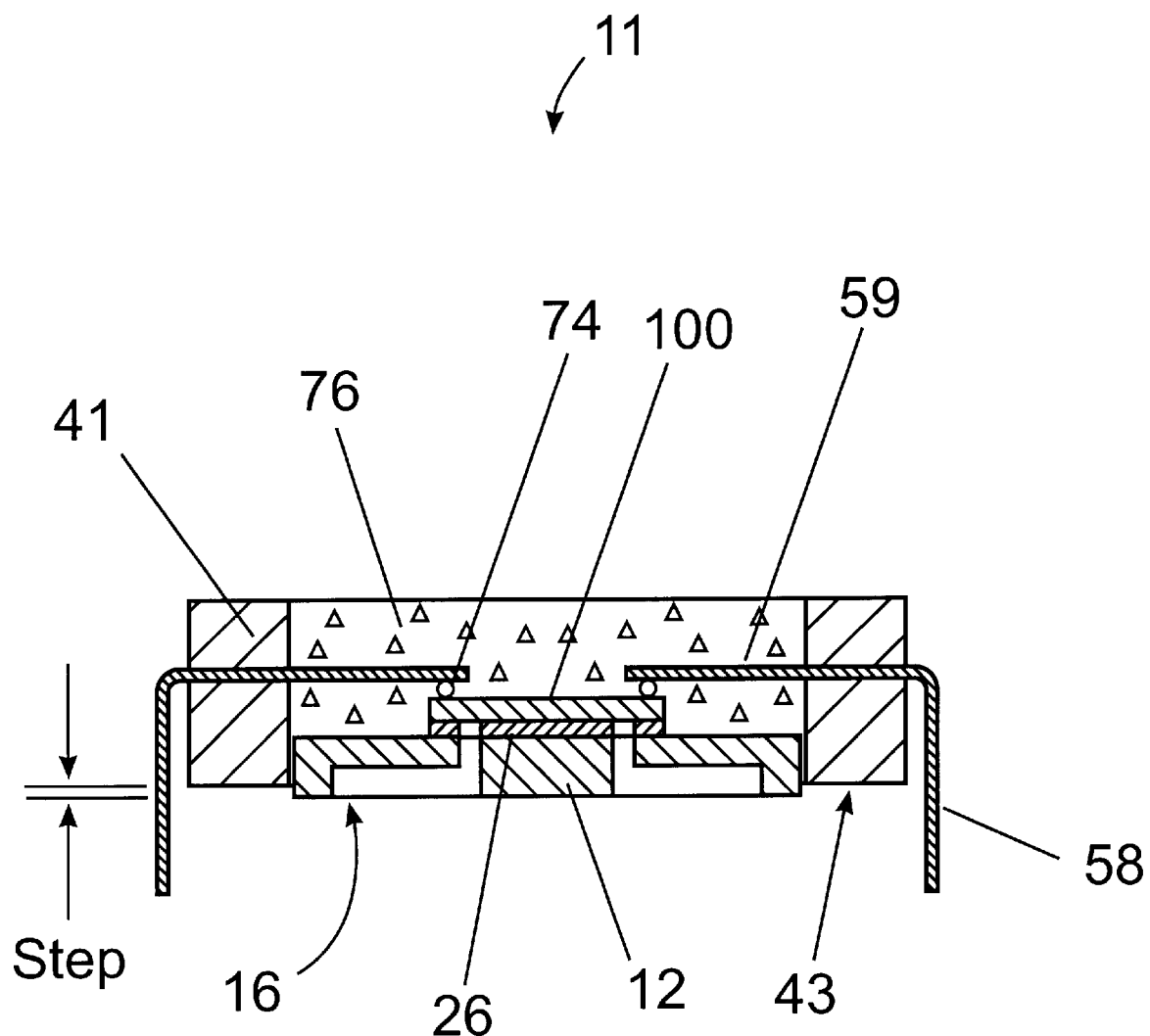
FIG. 14 illustrates a cross-section view of a fourteenth example of a packaged electro-microfluidic device, according to the present invention.

FIG. 14 illustrates a cross-section view of a fourteenth example of a packaged electro-microfluidic device, according to the present invention. Device 100 is attached to substrate 12 with adhesive gasket 26. Package 11 comprises a rectangular frame 41 that surrounds and houses substrate 12. Electrical leads 58 are at least partially embedded within frame 41. The proximal end of lead 58 comprises a cantilevered beam lead 59, which extends over device 100. Consequently, substrate 12 with attached device 100 must be inserted from the bottom of frame 40 during assembly. Device 100 is electrically connected to beam lead 59 via a solder-bumped joint 74. The open space inside of frame 41 is filled with a liquid encapsulant material 76. Hardened encapsulant 76 provides mechanical support for substrate 12 and attached device 100, and provides environmental protection to device 100 and adhesive gasket layer 26. Frame 41 includes a lower surface 43. Lower surface 43 can extend a small distance above the lower surface 16 of substrate 12, thereby forming a positive step (not numbered). The purpose of having a small positive step is to insure good contact of the lower surface 16 of substrate 12 with the surface of the external fixture (not shown). Therefore, the step prevents any possible interference of lower surface 43 with the external fixture.

For severe operating environments, ceramic packages are generally stronger and more hermetic than plastic encapsulated packages. Cofired ceramic multilayers construction can be used for base 40, or other components of the present invention (e.g. for substrate 12). The multiple, stacked ceramic layers are formed by casting a blend of ceramic and glass powders, organic binders, plasticizers, and solvents into sheets or tapes. The organic components provide strength and flexibility to the green (unfired) sheets during substrate personalization and fabrication. Burnout at a relatively low temperature (e.g. 350–600 C.) removes the organic binders and plasticizers from the substrate layers and conductor/resistor pastes. After burnout, these parts are fired at much higher temperatures, which sinters and densifies the glass-ceramic substrate to form a dense, rigid, insulating structure.

Two different cofired ceramic systems can be used, depending on the choice of materials: high-temperature cofired ceramic (HTCC), and low-temperature cofired ceramic (LTCC). If the proportion of ceramic-to-glass is high (e.g. ⁹⁄₁, or greater), the green substrate layer can only be sintered (e.g. densified) at high firing temperatures (e.g. 1300 to 1800 C.). Consequently, the thick-film pastes (e.g. to form metallized trace 78) that are typically cofired with the substrate also have to withstand these high temperatures, such as tungsten, or alloys of molybdenum and manganese. The dielectric consists of glass fillers in a ceramic matrix. This system is referred to as HTCC. Alternatively, the dielectric can be a ceramic-filled glass matrix, which can be sintered at much lower firing temperatures (e.g. 600 C. to 1300 C.). Thick-film metallization can comprise high-conductivity metals, such as gold, silver, copper, silver-palladium, and platinum-gold. This system is referred to as LTCC.

Figure 15:
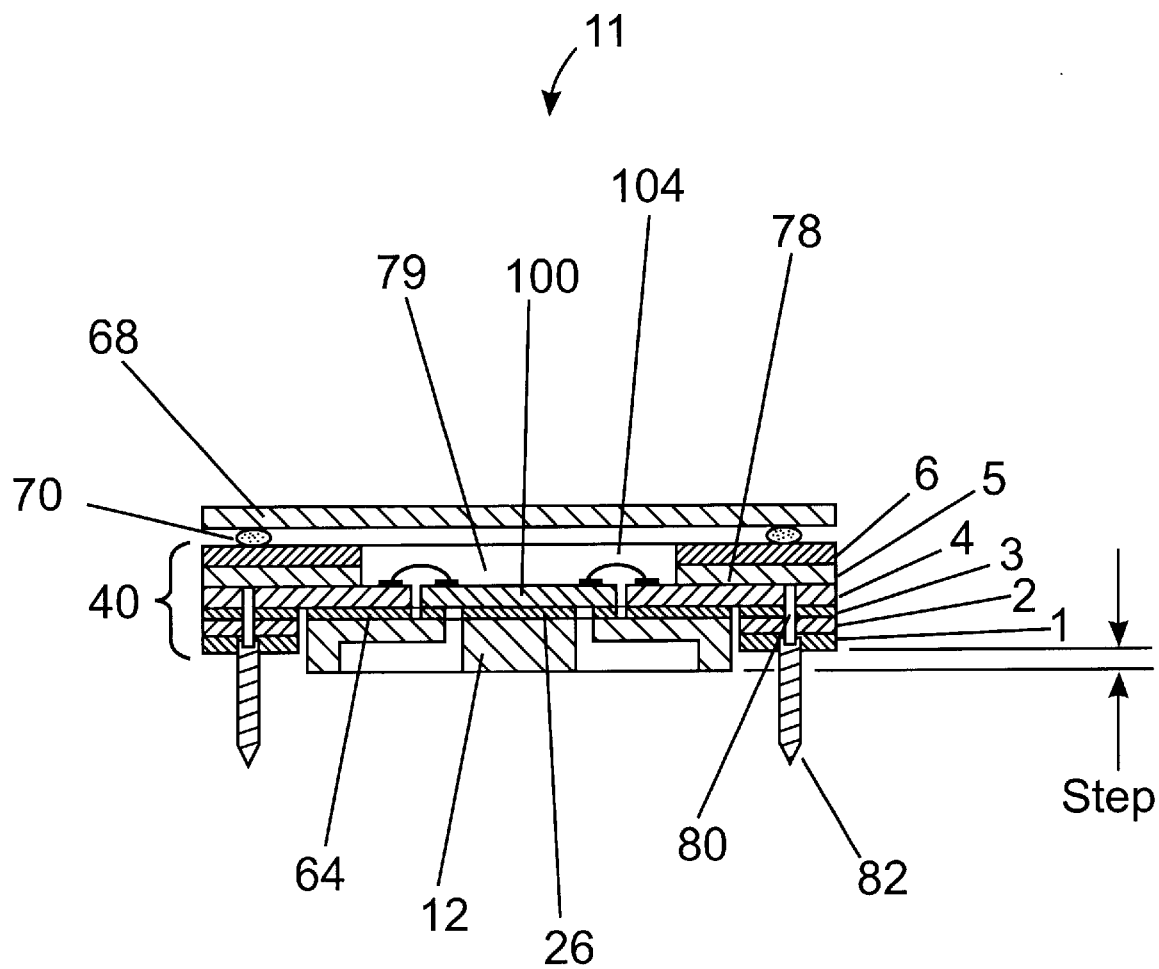
FIG. 15 illustrates a cross-section view of a fifthteenth example of a packaged electro-microfluidic device, according to the present invention.

FIG. 15 illustrates a cross-section view of a fifthteenth example of a packaged electro-microfluidic device, according to the present invention. Device 100 is attached to substrate 12 with adhesive gasket 26. Base 40 is attached to upper surface 14 of substrate 12. Base 40 comprises a multi-layered, laminated construction. In this example, base 40 has six original layers. The first three layers (counting from the bottom) form a recessed cavity (not numbered), which houses substrate 12. The fourth layer has an electrical trace 78 disposed on its upper surface. Trace 78 is wirebonded 104 to electrical bonding pads 102 on device 100. Trace 78 is connected to electrically conductive via 80, which is connected to electrical connection pins 82. Connection pins 82 can be arranged in a standardized geometry, i.e. a Pin-Grid-Array (PGA). Substrate 12 (with or without attached device 100) can be attached to the lower surface of the fourth laminate layer in base 40 via adhesive 64. Laminate layers #5 and #6 of base 40 define an upper recessed cavity 79 that houses wirebonds 104. Cover lid 68 can be attached to the upper surface of the sixth laminate layer with sealring 70. Adhesive layer 64 and adhesive gasket 26 can both be part of the same piece of adhesive film.

Figure 16:
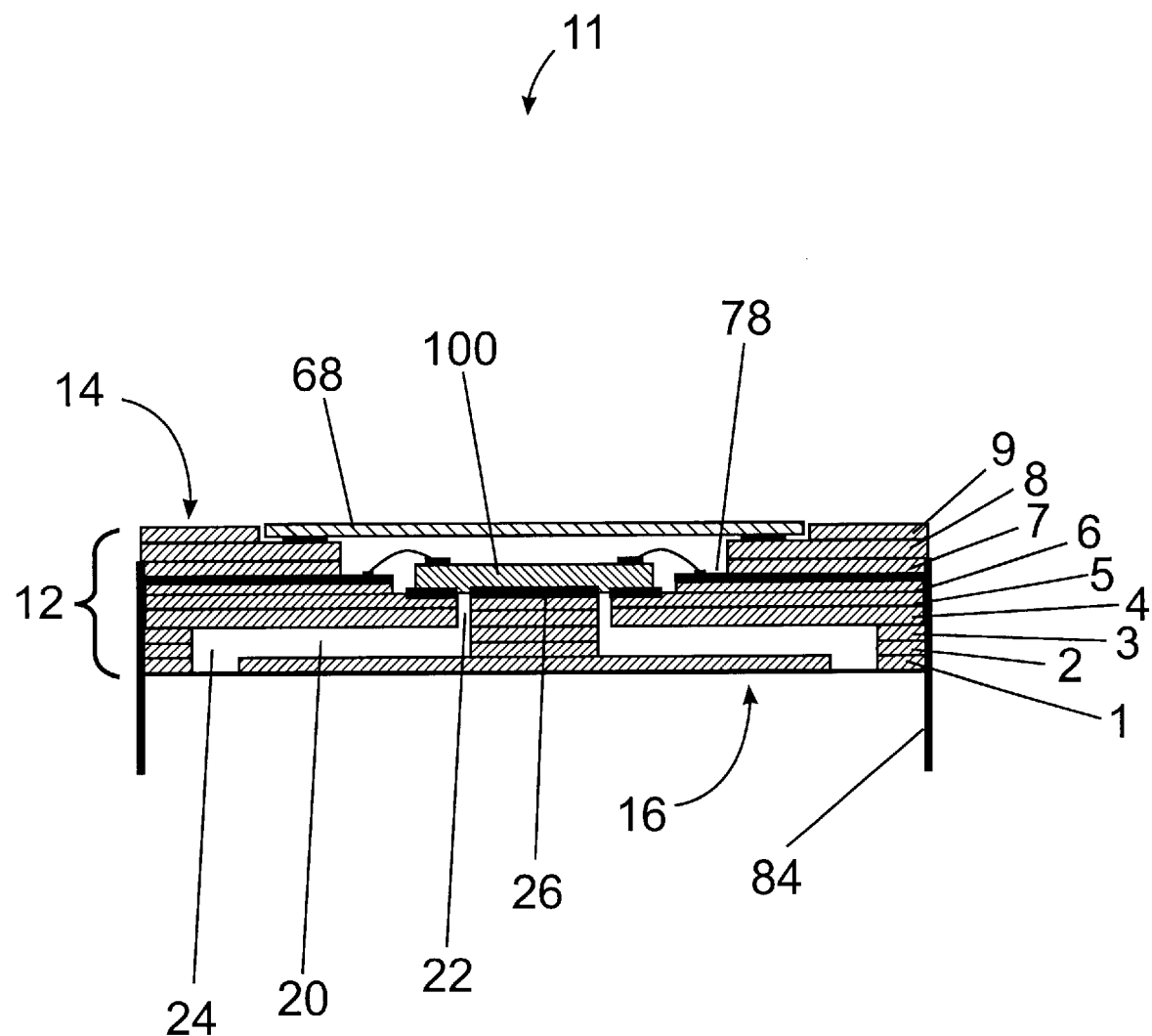
FIG. 16 illustrates a cross-section view of a sixteenth example of a packaged electro-microfluidic device, according to the present invention.

FIG. 16 illustrates a cross-section view of a sixteenth example of a packaged electro-microfluidic device, according to the present invention. Electro-microfluidic device 100 is attached to substrate 12 via adhesive gasket 26. Substrate 12 comprises a multi-layered construction. In this example, nine layers are stacked and bonded together. Substrate 12 can be fabricated of LTCC or HTCC co-fired ceramic multilayered material, as described above. Side-mounted electrical pins 84 can be brazed to the sidewall 18 of substrate 12, and electrically connected to metallized electrical trace 78. Trace 78 can be disposed on the upper surface of layer #6 (counting from the bottom of the stack). Cover lid 68 can be attached to the upper surface of substrate 12, inside of a shallow recessed rim. Cover lid 68 can have a rectangular or circular shape, and can be transparent or opaque. Cover lid 68 can be made of metallic alloy, glass, plastic material, or a ceramic material. Fluidic channels 20 are disposed inside of substrate 12, and can be fabricated by stacking multiple layers of personalized sheets that have had individual patterns cutout that define the tapered cross-section of the internal flow channels. The first (e.g. bottom) layer in this example replaces, and serves the function of, closeout plate 32 (described previously in FIG. 7).

Figure 17A:
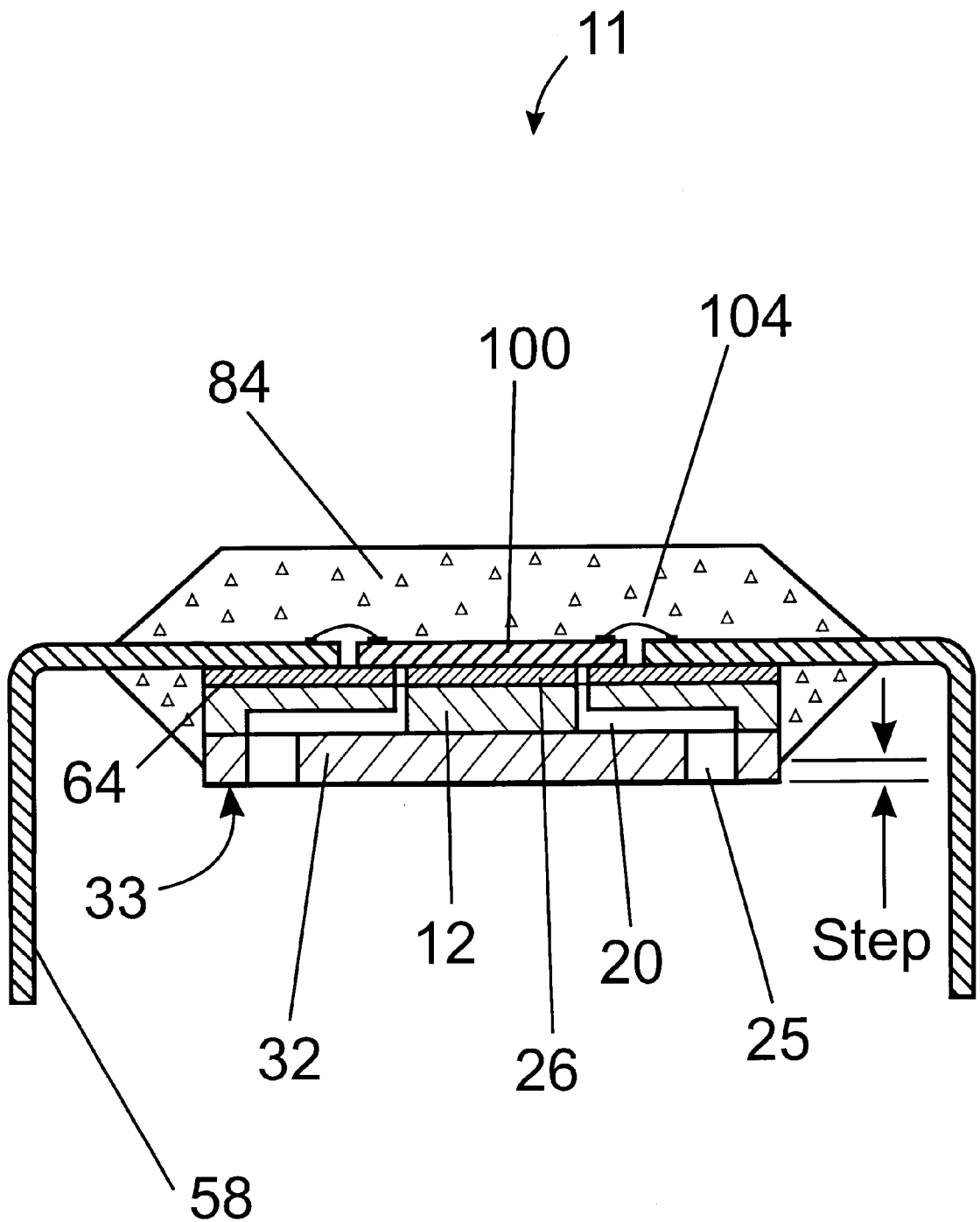
FIG. 17A illustrates a cross-section view of a seventeenth example of a packaged electro-microfluidic device, according to the present invention.

FIG. 17A illustrates a cross-section view of a seventeenth example of a packaged electro-microfluidic device, according to the present invention. Device 100 is attached to substrate 12 via adhesive gasket 26. Closeout plate 32 is attached to the bottom surface 16 of substrate 12. Electrical leads 58 are attached to the upper surface of substrate 12 with adhesive layer 26. Device 100 is wirebonded to lead 58. Lead 58 can comprise a lead frame having a plurality of individual electrical leads arranged in a standardized geometry (e.g. DIP, Quad Flat. Pack, etc.), for example, with a lead pitch equal to 0.1 inches. The pre-assembly comprising substrate 12, attached device 100, and lead frame 58 is substantially encapsulated in a plastic molded body 84. However, the lower surface 33 of closeout plate 32 is not encapsulated with plastic material 84, thereby providing free access to fluidic opening 25. Plastic molded body 84 can be injection or transfer-molded using well-known polymeric materials.

Figure 17B:
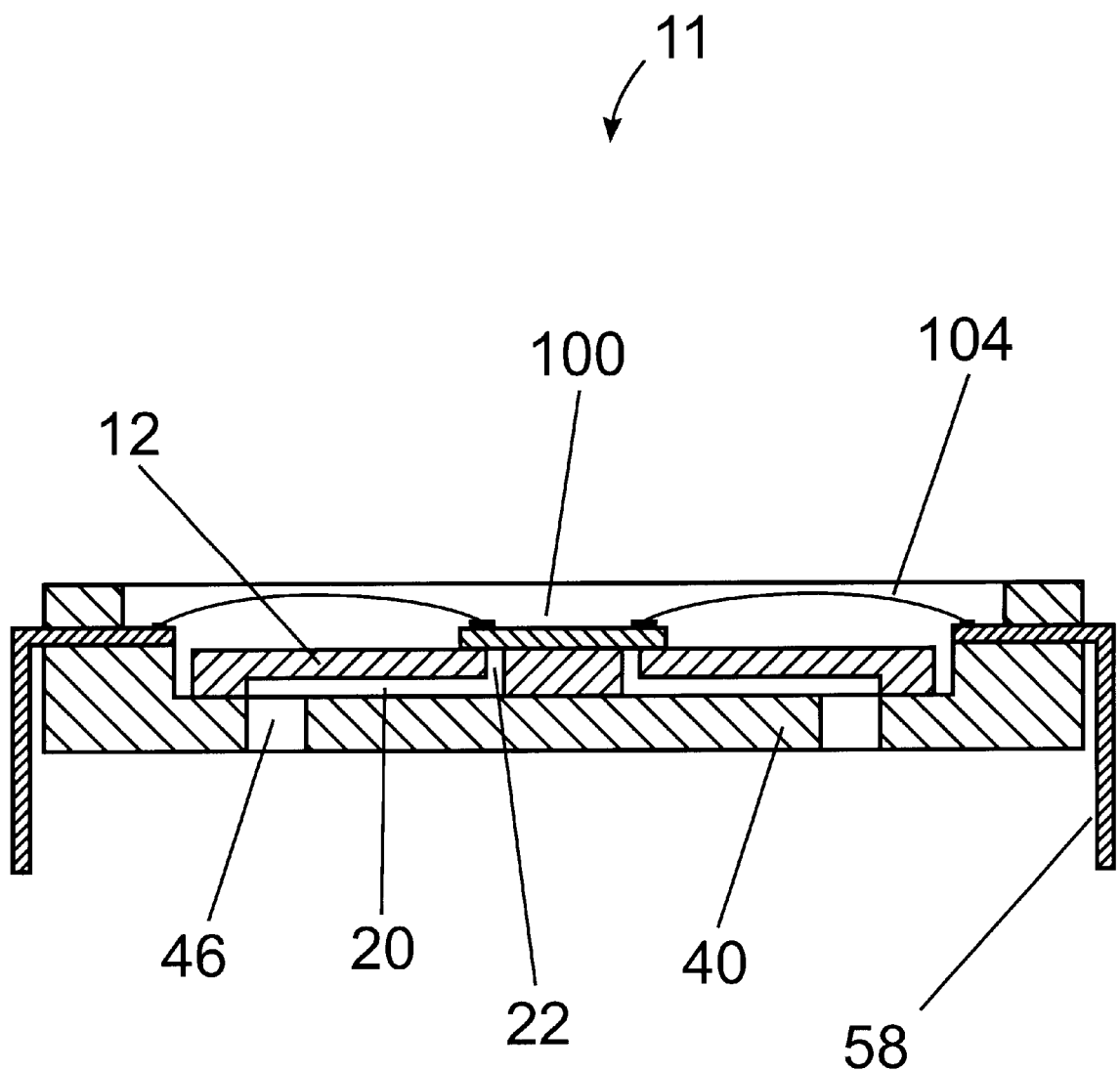
FIG. 17B illustrates a cross-section view of an eighteenth example of a packaged electro-microfluidic device, according to the present invention.

FIG. 17B illustrates a cross-section view of a eighthteenth example of a packaged electro-microfluidic device, according to the present invention. In this example, substrate 12 is bonded directly to base 40 and directly to electro-microfuidic device 100, without using an intermediate layer of adhesive film. This type of construction can be accomplished, for example, by using a thermoplastic material for substrate 12, and then heating substrate 12 to a softening temperature sufficiently high to become tacky and, hence, enable adhesion to the adjoining mating surfaces.

Figure 17C:
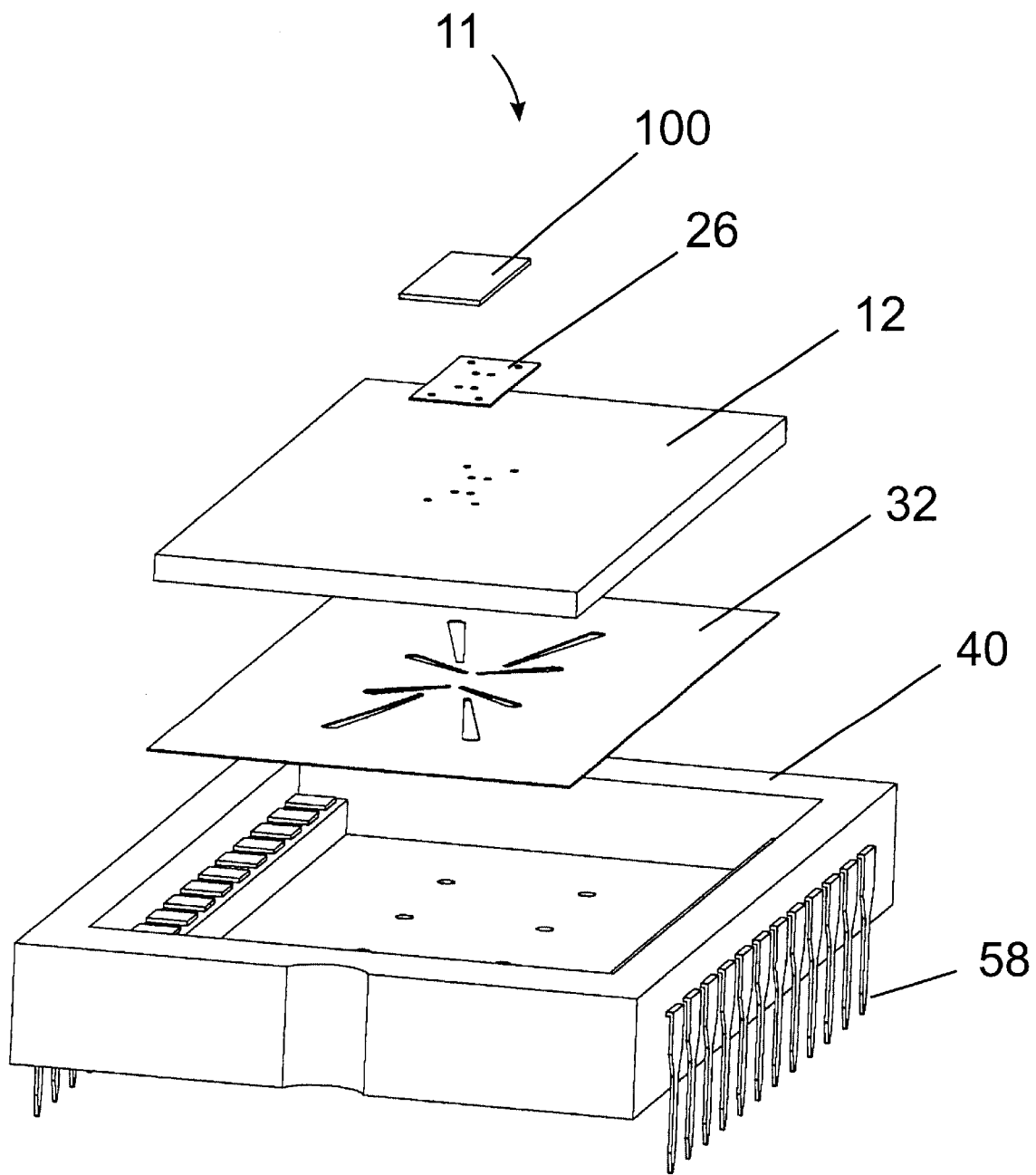
FIG. 17C illustrates an exploded isometric view of a ninthteenth example of a packaged electro-microfluidic device, according to the present invention.

FIG. 17C illustrates an exploded isometric view of a nineteenth example of a packaged electro-microfluidic device, according to the present invention. Device 100 is attached to fan-out substrate 12 with first adhesive layer 26. Substrate 12 is attached to modified DIP base 40 with second adhesive layer 32.

Electro-Microfluidic Assembly

The following set of Drawings illustrates examples of an assembly of a packaged electro-microfluidic device attached to an external fixture.

Figure 18:
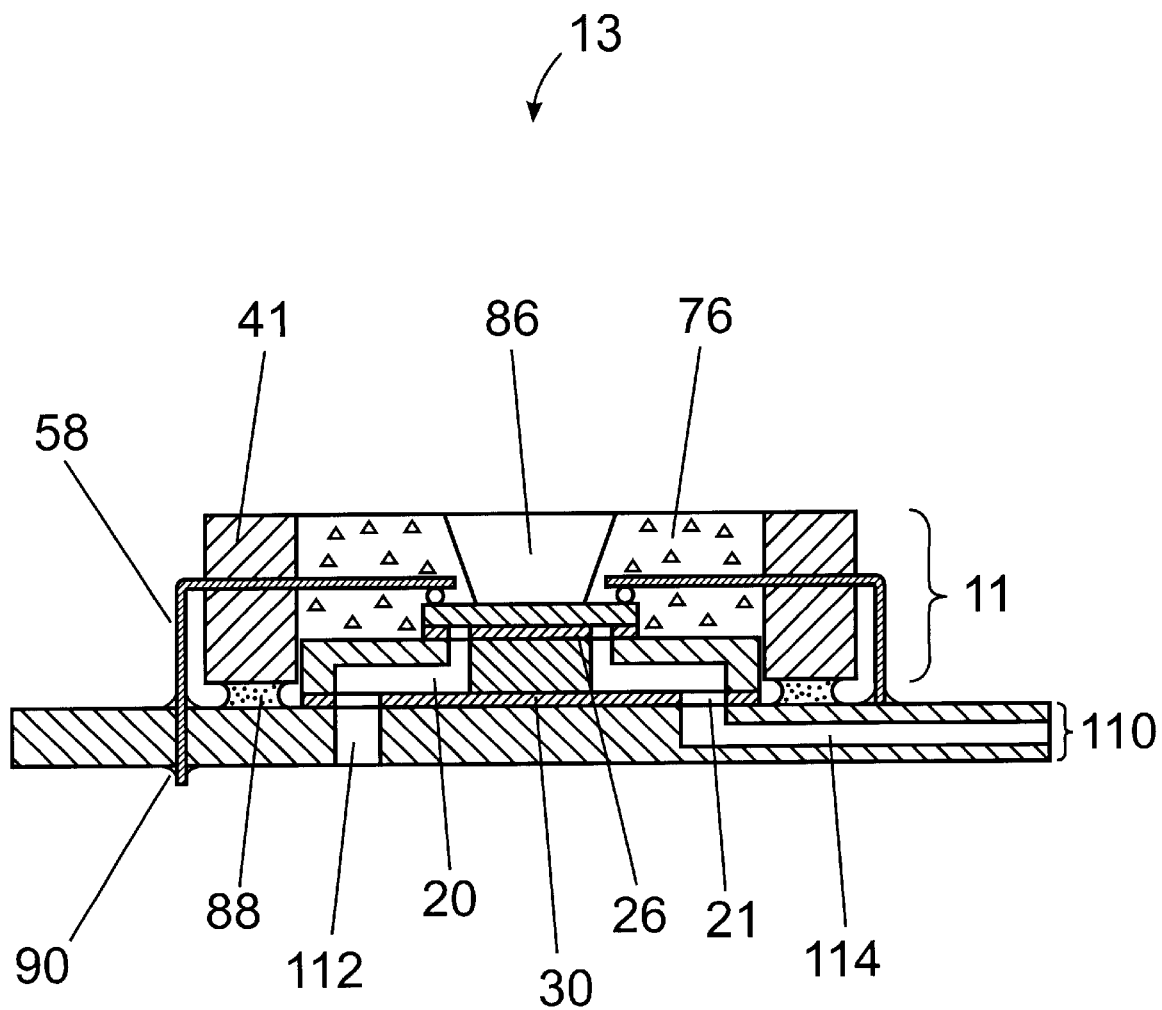
FIG. 18 illustrates a cross-section view of a twentieth example of an electro-microfuidic assembly, according to the present invention.

FIG. 18 illustrates a cross-section view of a twentieth example of an electro-microfuidic assembly, according to the present invention. Assembly 13 comprises an external fixture, which (in this example) is a fluidic printed wiring board 110 (FPWB). Package 11 is surface mounted to FPWB 110. Package 11 comprises electro-microfluidic device 100 mechanically and fluidically coupled to fan-out substrate 12, and electrically connected to electrical leads 58. Leads 58 are inserted into PFWB 110 and soldered, making solder joint 90. Fluidic penetrations 21 in second adhesive layer 30 are aligned with, and fluidically coupled the respective openings of fluidic channels 112 and 114 disposed within FPWB 110. Underfill sealant 88 can be disposed between the lower surface 43 of frame 41 and FPWB 110. Channel 112 can transverse across the thickness of FPWB 110. Alternatively, channel 114 can turn ninety degrees and travel inside FPWB 110 parallel to the surface of the board. Opening 86 (e.g. window) can be disposed inside of encapsulant material 76, thereby providing free optical, fluidic, or mechanical access to the upper surface of electro-microfluidic device 100.

Referring still to FIG. 18, push-through electrical leads 58 can be arranged as a Dual In-Line Package (DIP), a Ceramic Dual In-Line Package (CERDIP), a Single In-Line Package (SIP), a Pin-Grid Array (PGA), a zig-zag QUIP package, and a Zero-Insertion-Force socket (ZIF) mount. Lead spacing can be a standard 0.1 inch. Pin counts, for example, in a DIP package, can range from 8–16 pins to as many as 64 pins.

Figure 19:
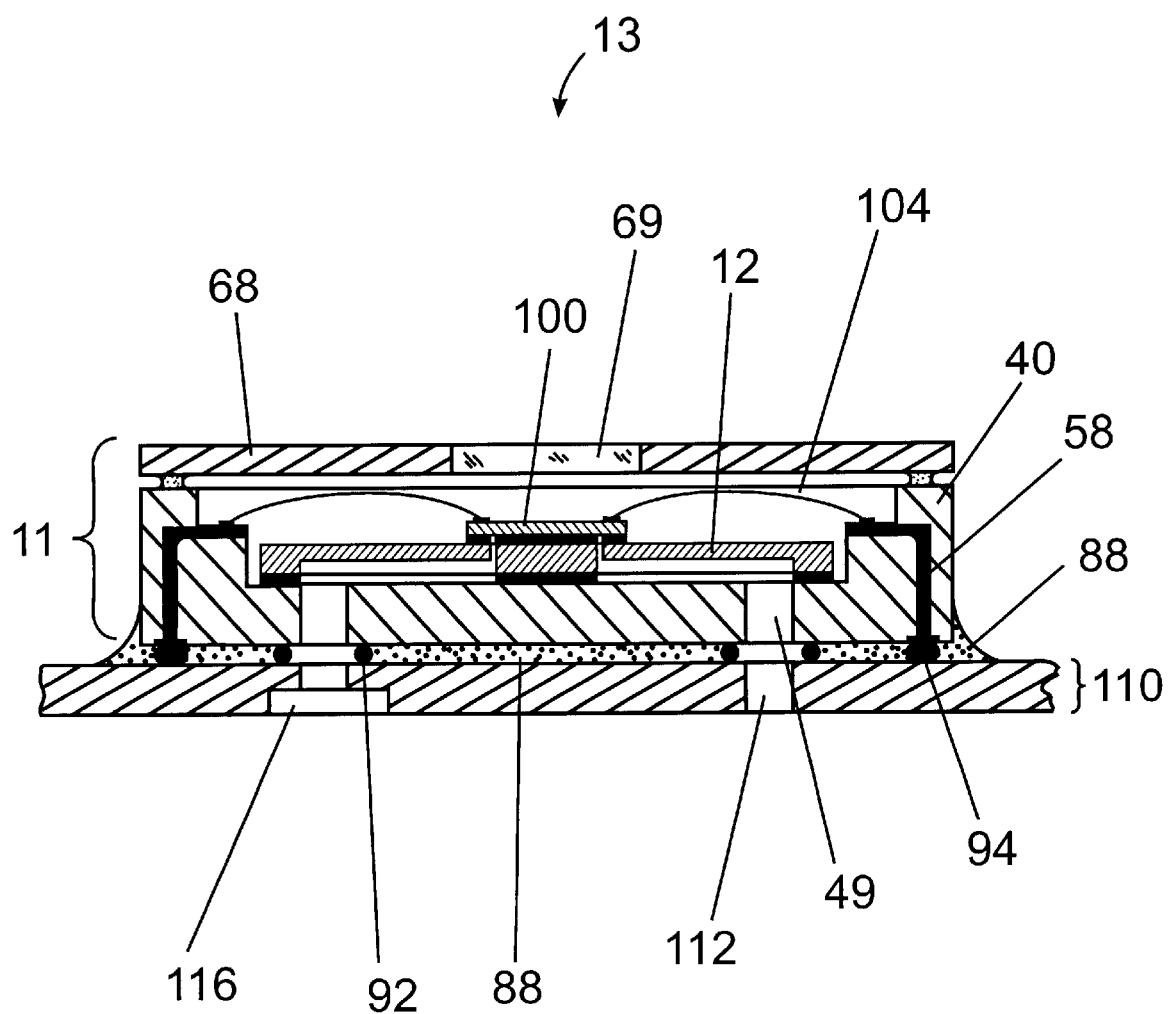
FIG. 19 illustrates a cross-section view of a twenty-first example of an electro-microfuidic assembly, according to the present invention.

FIG. 19 illustrates a cross-section view of a twenty-first example of an electro-microfuidic assembly, according to the present invention. Package 11 is mounted to FPWB 110, wherein package 11 comprises electro-microfluidic device 100 mechanically and fluidically coupled to fan-out substrate 12, which is fluidically coupled to base 40, and electrically connected to electrical leads 58. Fluidic opening 49 on base 40 is fluidically coupled to FPWB 110 via a sealring 92. Sealring 92 can be a conventional O-ring made of rubber, silicone, etc. Alternatively, sealring 92 can be made of a solder or braze material that is melted and reflowed. Use of solder or braze for sealring 92 would require metallization of the joining surfaces, e.g. on the underside of package 11 and on the upperside of FPWB 110, to enable wetting of the molten solder. Alternatively, sealring 92 can be made of a thermoplastic material, which becomes tacky and adhesive after heating above its softening temperature. Lead 58 can be electrically interconnected to FPWB 110 via solder or conductive polymer bump 94. Bumped joint 94 and/or sealring 92 can be underfilled with a thermal-expansion-matched underfill material 88 (e.g. epoxy with silica or alumina particles). In this example, fluidic channel 116 in FPWB 110 can comprise a counter-bore for receiving a tubular connection. Package 11 can comprise a cover lid 68, having an integral transparent window 69, such as a transparent glass, plastic, or quartz material. Package 11 can be surface mounted to FPWB 110. Other surface mounting arrangements can be used, including a Quad Flat Pack package, a Flip-Chip solder bump mount, a leadless chip carrier mount, a plastic leaded chip carrier mount, a Ball-Grid Array (BGA) mount, a Plastic Ball-Grid Array (PBGA), a beam lead mount, a Tape Automated Bonding (TAB) mount, and a wire bonded interconnection.

Figure 20:
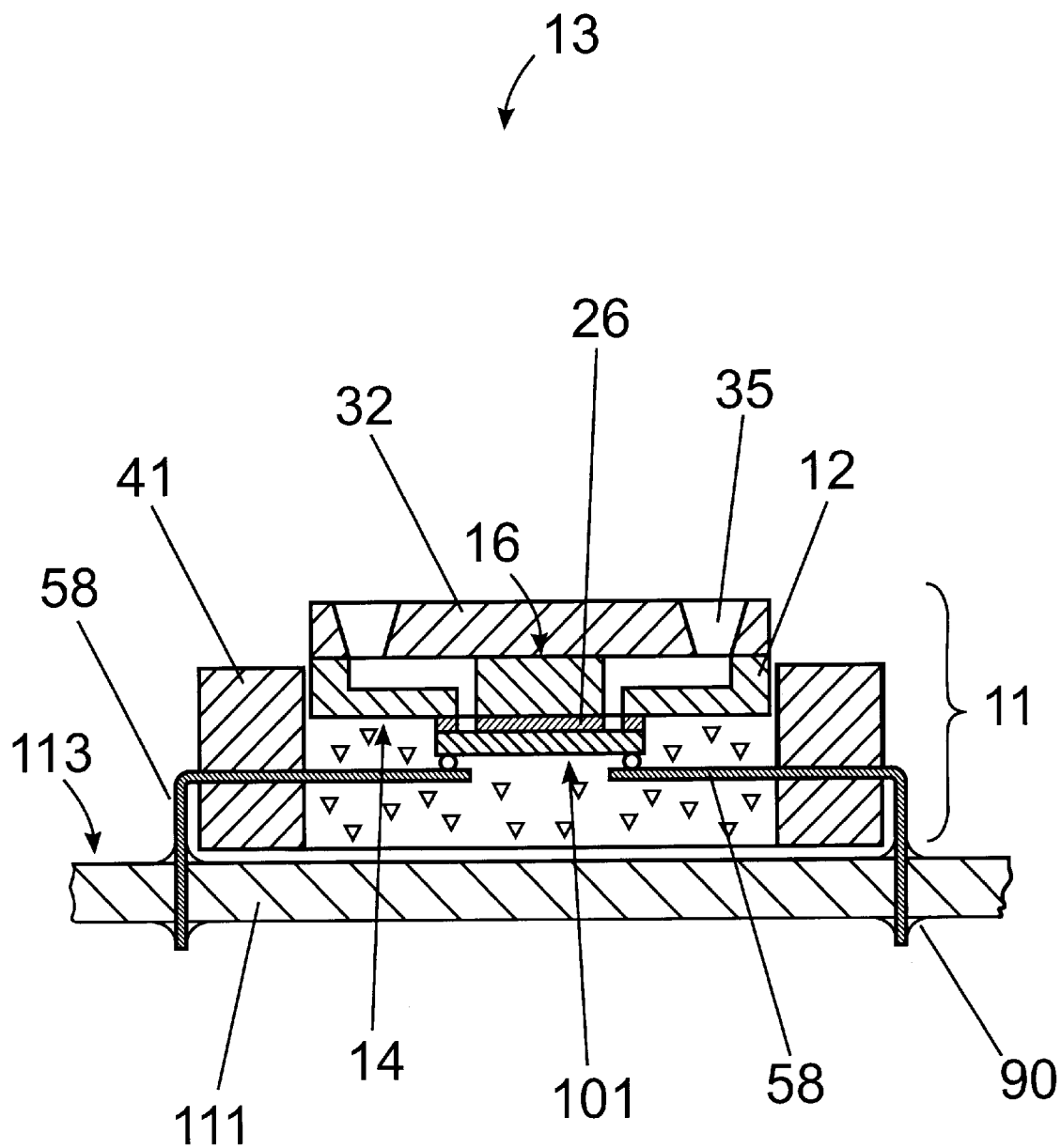
FIG. 20 illustrates a cross-section view of a twenty-second example of an electro-microfuidic assembly, according to the present invention.

FIG. 20 illustrates a cross-section view of a twenty-second example of an electro-microfluidic assembly, according to the present invention. Package 11 is mounted to a standard printed circuit board 111 (e.g. without fluidic channels) with push-through soldered electrical leads 58. Electro-microfluidic device 100 is attached to fan-out substrate 12 with adhesive gasket 26. Device 100 is solder-bumped to cantilevered beam lead 58, which extends inwards from frame 41. However, in this example, device 110 and substrate 12 are mounted "upside down". In this configuration surface 14 of substrate 12 faces the upper surface 113 of board 111. Closeout plate 32 is attached to surface 16 of substrate 12 Plate 32 comprises fluidic ports 35. This arrangement is useful for applications where a micropipette is used to drop small drops of fluid into access ports 35, such as for a DNA analyzer or blood glucose sugar analyzer. Ports 35 can have a tapered cross-section. Other fluidic connections can be made to port 35, e.g. by microcapillary glass tube or flexible tubing. Ports 35 can provide gaseous access, e.g. for a micro-chem-lab chemical sensor (e.g. sniffer).

Figure 21:
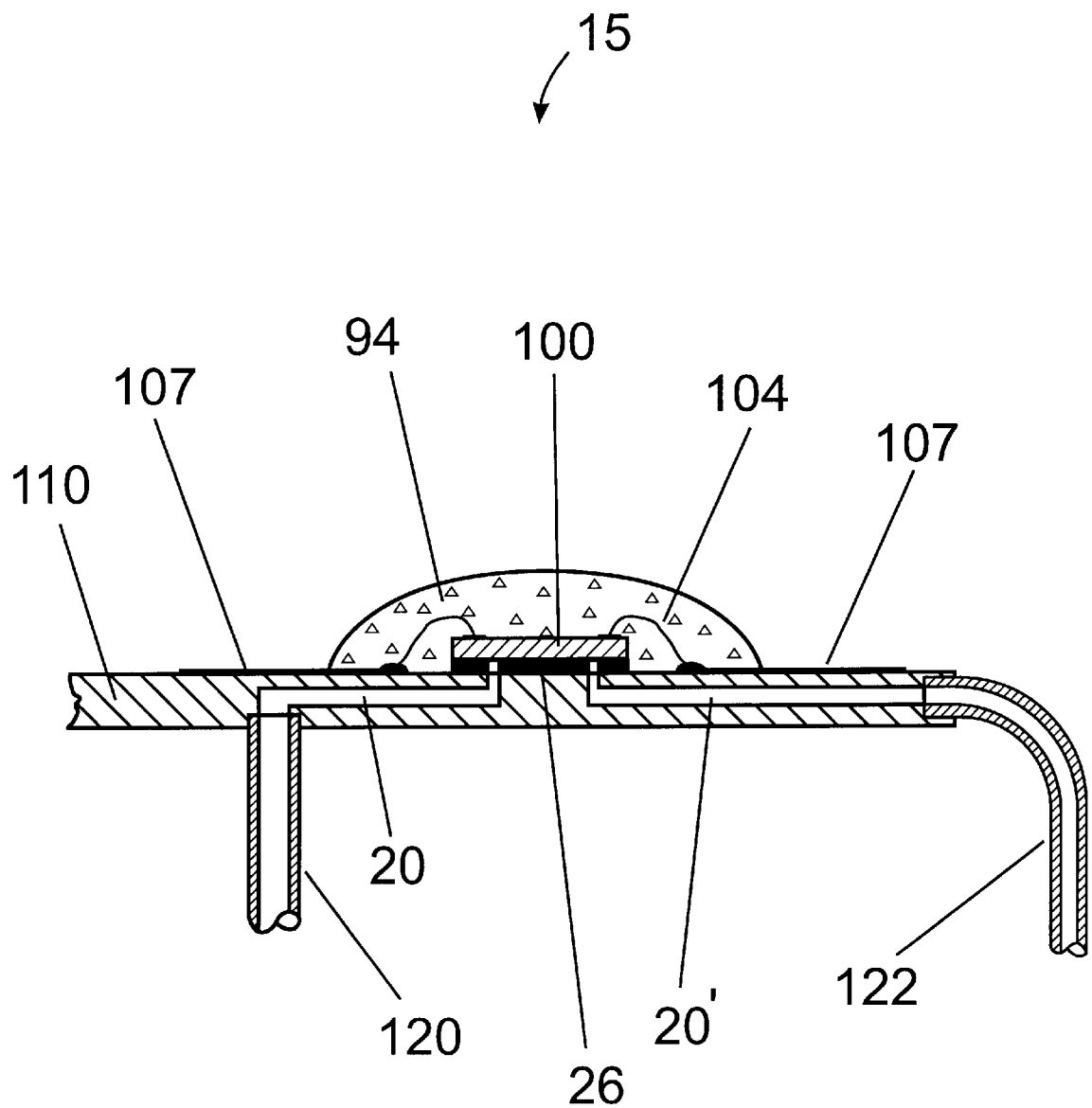
FIG. 21 illustrates a cross-section view of a twenty-third example of an electro-microfuidic assembly, according to the present invention.

FIG. 21 illustrates a cross-section view of a twenty-third example of an electro-microfuidic assembly, according to the present invention. Assembly 15 comprises an electro-microfluidic device 100 attached directly to a fluidic printed wiring board (FPWB) 110. Adhesive gasket 26 provides combined mechanical bonding and fluidic coupling between fluidic inlet and outlet ports on the bottom side of device 100 (e.g. ports 101), and fluidic channels 20 and 20' disposed inside of FPWB 110. Assembly 15 can further comprise microcapillary glass tube 120 attached to the backside of FPWB 110 and fluidically coupled to channel 20. Alternatively, flexible tubing 122 can be attached to channel 20' protruding from the edge of FPWB 110. Tubing 122 can have a standard outer diameter equal to 1/16 inch. Device 100 can be wirebonded directly to electrical traces 107 surface printed on the upper surface of FPWB 110. Device 100 and wirebonds 104 can optionally be overmolded with a protective glob-top epoxy layer 94.

Figure 22:
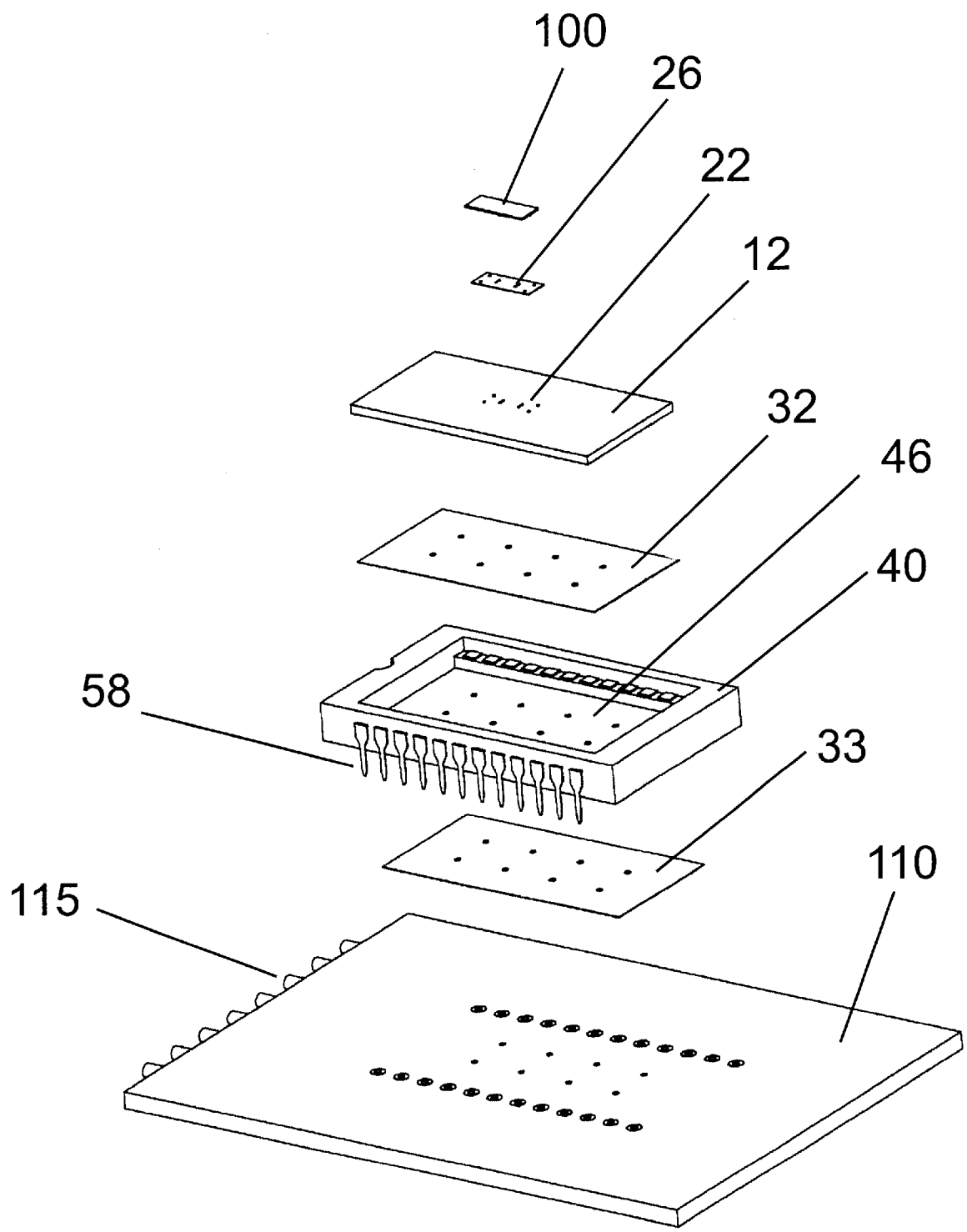
FIG. 22 illustrates an exploded isometric view of a twenty-fourth example of an assembly of a packaged electro-microfluidic device mounted on a fluidic printed wiring board, according to the present invention.
Figure 23:
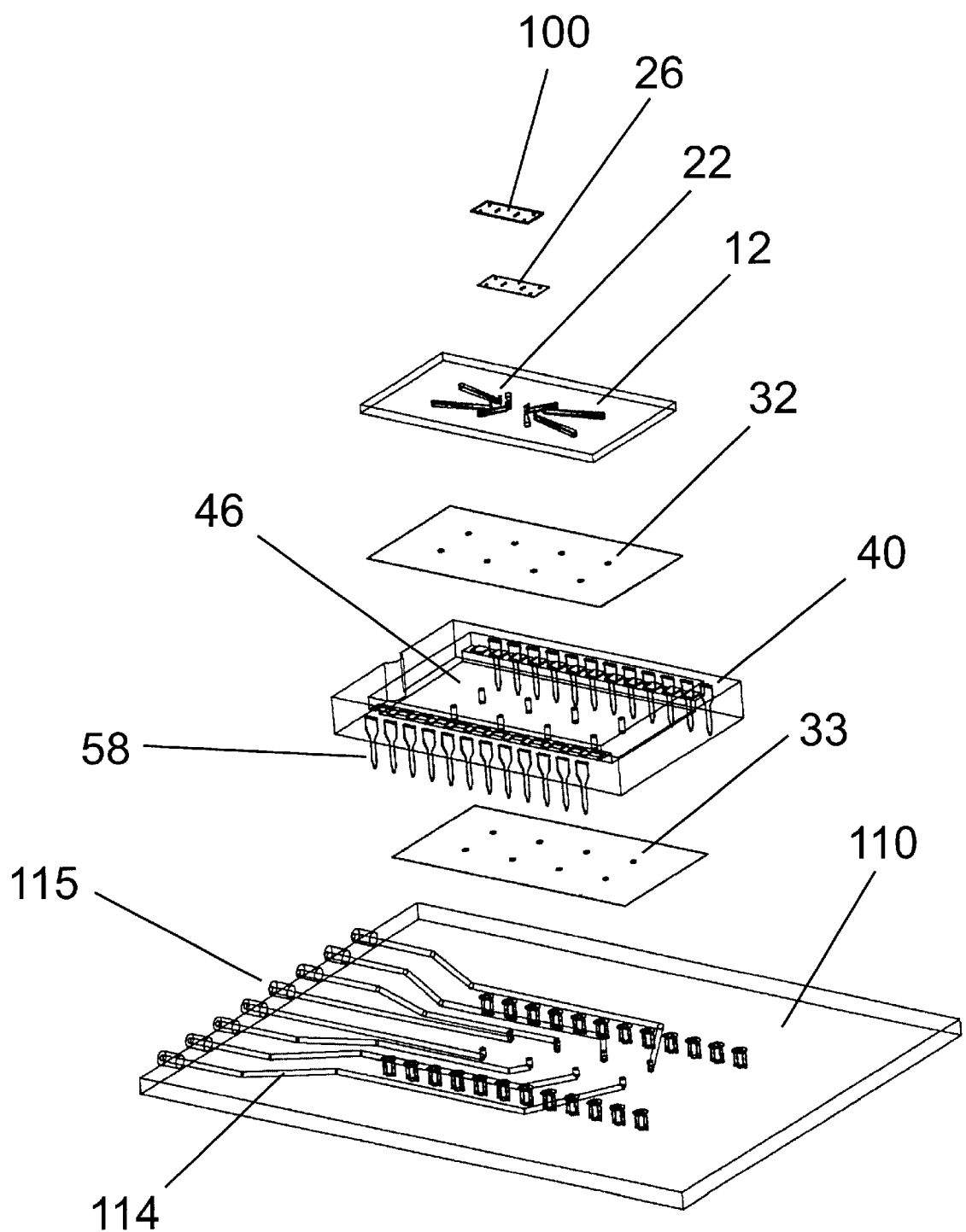
FIG. 23 illustrates an exploded isometric wireframe view of a twenty-fifth example of a packaged electro-microfluidic device, according to the present invention.

FIGS. 22 and 23 illustrate an exploded isometric view of a twenty-fourth and a twenty-fifth example of a packaged electro-microfluidic device mounted on a fluidic printed circuit board, according to the present invention. Device 100 is attached to fan-out substrate 12 with first adhesive layer 26. Substrate 12 is attached to modified DIP base 40 with second adhesive layer 32. Modified DIP base 40 is electrically connected to fluidic printed wiring board 110 via soldered push-through electrical pins 58. Base 40 is fluidically connected to board 110 with third adhesive layer 33. In FIG. 23, a wireframe view is presented, which illustrates the internal features of each part. In particular, the internal fluidic channels 20 of fan-out substrate 12 can be seen. Also, the internal fluidic channels 114 of board 110 can be seen, terminating in external tubing couplers 115.

Method of Fabricating an electro-microfluidic Package

Figure 24A:
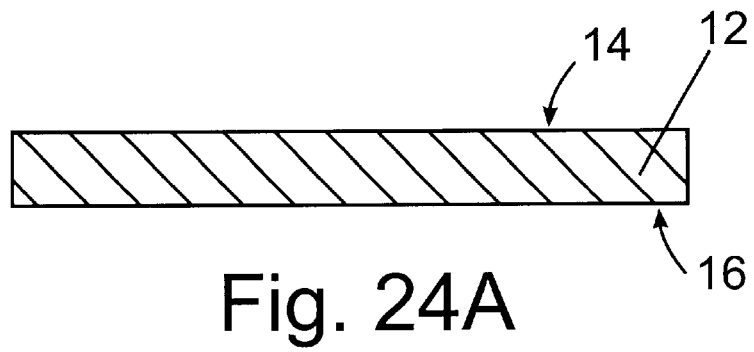
FIGS. 24A–D illustrate a twenty-sixth example of a method of fabricating a package for housing an electro-microfluidic device, according to the present invention.
Figure 24B:
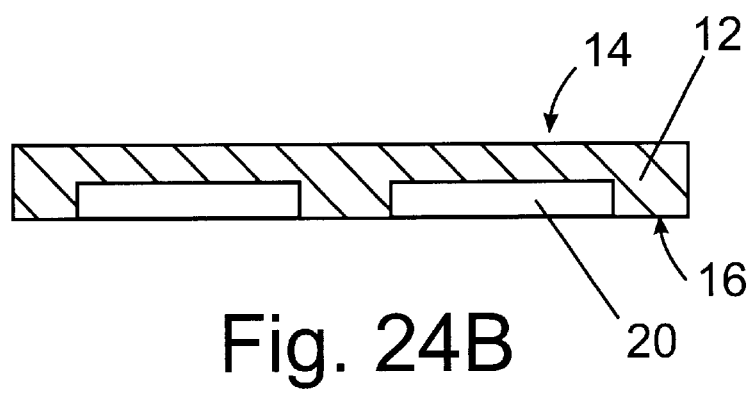

FIGS. 24A–D illustrate a twenty-sixth example of a method of fabricating a package for housing an electro-microfluidic device, according to the present invention. In FIG. 24A, a substantially planar substrate 12 is provided, having an upper surface 14 and an opposing lower surface 16. Next, in FIG. 24B, a plurality of open trenches 20 are created by introducing recessed cavities into the lower surface 16 of substrate 12. A variety of material removal methods can be used to create the cavities, e.g. milling with a miniature milling tool, laser milling, chemical etching, or abrasive jet spray milling. Alternatively, the part shown in FIG. 24B (i.e. substrate 12) can be fabricated by using an additive process, such as rapid prototyping with built-up plastic layers, thermal spray metal deposition, cold spray deposition, Laser Engineered Net Shape (LENS™) directed metal deposition, casting, molding, injection molding of a moldable material, cold-isostatic processing, hot isostatic processing, sintering, lamination, etc.

Figure 24C:
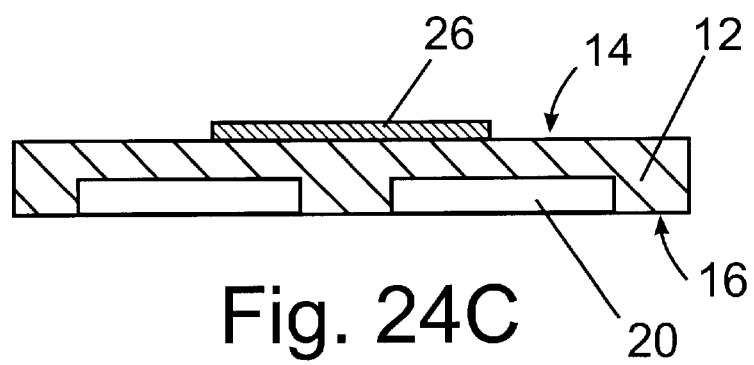

Next, in FIG. 24C, a first. adhesive layer 26 of material is applied to upper surface 14 of substrate 12. This step can comprise: (a) providing a strip of adhesive transfer tape, wherein the tape comprises a first layer of adhesive film covered by an upper and a lower releasable liner; (b) making a segment of tape by cutting the strip into a shape that approximately matches the outline of the electro-microfluidic device; (c) removing the lower liner of the tape; (d) positioning the layer of adhesive 26 above the upper surface 14 of the substrate 12, while overlapping at least part of the fluidic channel 20; and (e) adhering the layer of adhesive 26 to the upper surface of the substrate by applying pressure to the adhesive. A pressure of about 15 psi can be applied to insure good adhesion. Additionally, the joint can be baked at a temperature of between 60 C. and 70 for approximately 1 hour to improve adhesive wetout of the substrate. Upper surface 14 should be relatively flat and clean prior to bonding.

Figure 24D:
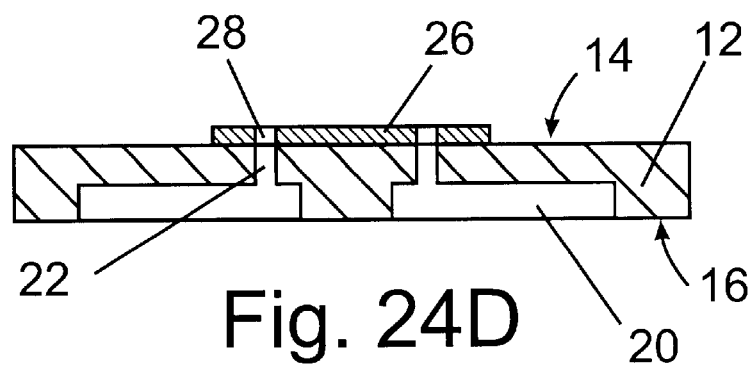

Finally, in FIG. 24D, one or more holes is drilled in the upper releasable liner (not numbered), adhesive film layer 26, and substrate 12, thereby creating a fluidic passageway into fluidic channel 20. Methods of drilling include conventional drilling with a miniature or micro drill bit, water jet drilling, abrasive jet spray drilling, chemical etching, ultrasonic drilling, and laser drilling. Laser drilling can utilize short wavelength excimer lasers, such as krypton fluoride (248 nm), or argon fluoride (193 nm), which emit short pulses of UV light. Nd:YAG or $CO_2$ lasers can also be used. Short laser pulses can be used (e.g. femtosecond). Lasers can drill holes in polymers, ceramics, glasses, optical materials, and thin films. Mask projection methods can be used. Laser drilling can drill holes as small as 1–5 microns in tough materials, such as Teflon, fused silica, or sapphire (among others). Laser drilling is particularly attractive because it produces minimal cutting debris. Alternatively, mechanical micro-drilling using ion-beam-milled milling bits can produce holes or trenches with dimensions as small as 25 microns (0.001 inches).

As the result of simultaneously drilling (e.g. match drilling) through both layers (i.e. 26 and 12),hole 28, in layer 26 is created, which aligns very closely with hole 22 in substrate 12. The requirement for precise alignment of the first adhesive layer 26 with the substrate 12 is mitigated and controlled by simultaneously drilling through both parts at the same time, and in a single setup (e.g. match drilling). The direction of drilling can proceed from either side. Drilling can proceed first through the upper protective liner, then through adhesive layer 26, and finally drilling through substrate 12 to a depth sufficient to intersect and penetrate into fluidic channel 20. Alternatively, drilling can proceed first through the lower surface of substrate 12 (i.e. inside the small end of channel 20), and then up through adhesive film 26, exiting at last through the upper protective liner.

Alternatively, the machining of open trenches 20 can be performed after holes 28 and 22 have been match-drilled.

Alternatively, substrate 12 can be fabricated by injection molding (not illustrated) a plastic material, using mold features that create fluidic channels 20 and holes 22. After injection molding, the adhesive layer 26 could be applied to upper surface 14. Finally, holes 28 could be drilled through layer 26 by utilizing pre-existing holes 22 in substrate 12 as a guide template. This method permits precise alignment of holes 28 and 22.

Figure 25A:
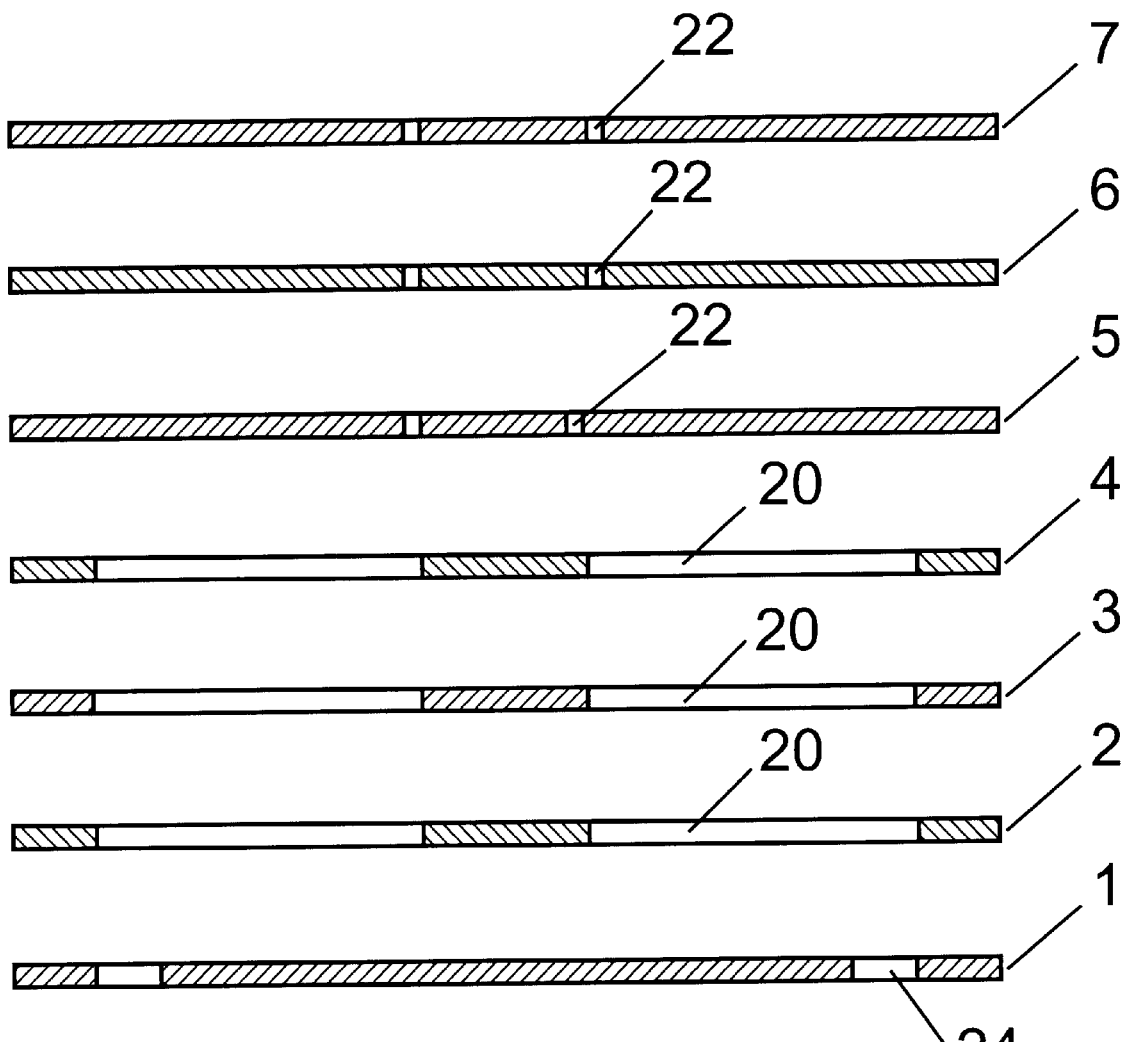
FIGS. 25A–C illustrate a twenty-seventh example of a method of fabricating a substrate from co-fired ceramic multilayers, according to the present invention.
Figure 25B:
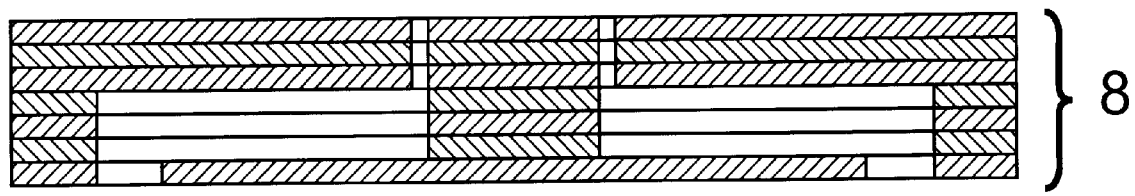
Figure 25C:
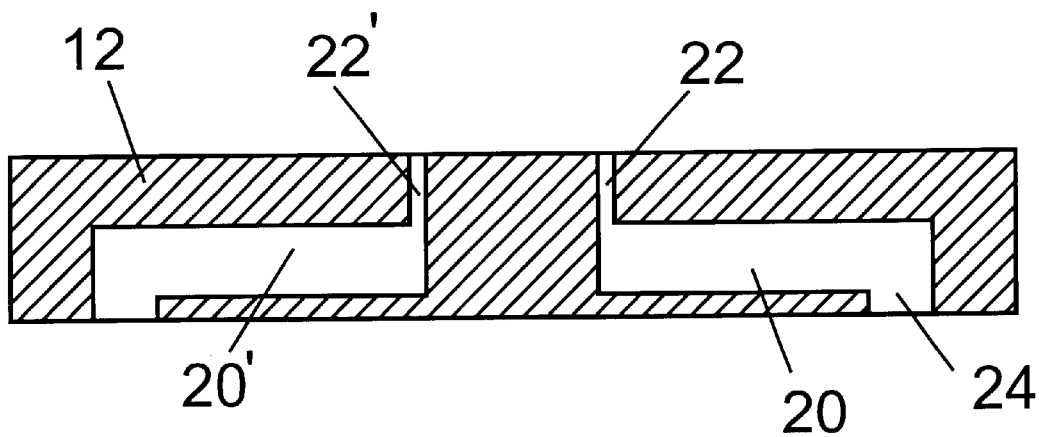

FIGS. 25A–C illustrate a twenty-seventh example of a process by which substrate 12 can be fabricated from co-fired ceramic multilayers. FIG. 25A shows an exploded cross-section view of seven layers of a glass-ceramic material, prior to assembly. The stacked ceramic layers are formed by casting a blend of ceramic and glass powders, organic binders, plasticizers, and solvents into sheets or tapes. The organic components provide strength and flexibility to the green (unfired) sheets during substrate personalization and fabrication. Burnout at a relatively low temperature (e.g. 350–600 C.) removes the organic binders and plasticizers from the substrate layers and conductor/resistor pastes. After burnout, these parts are fired at much higher temperatures, which sinters and densifies the glass-ceramic substrate to form a dense, rigid, insulating structure. In this example, each layer 1–7 has been personalized by cutting out an individualized pattern, specifically: hole 24 in layer #1; channel 20 in layers 2,3, & 4; and hole 22 in layers 5,6, & 7.

In FIG. 25B, the sheets have been stacked and registered (i.e. aligned) as an assembly 8, prior to baking and firing. FIG. 25C illustrates the final product, after baking and firing, wherein the individual layers 1–7 have fused and bonded together into a unitized and monolithic structure (i.e. substrate 12) having completely formed internal channels 20, including holes 22 and 24. Additionally, optional metallized electrical traces or conductive vias can be formed on any of the multiple layers during the LTCC or HTCC co-fired ceramic multilayer fabrication process. This is illustrated in FIG. 16, with reference to metallized traces 78.

In some situations, small diameter (e.g. 100 micron) hole 22 may be plugged by flow of the glass-ceramic layer during the firing step. In this case, post-firing processing can be performed to subsequently open up hole 22. This could involve micro-drilling or micro-reaming to open up hole 22. Alternatively, with reference to FIG. 25B, after the layers 1–7 have been stacked and registered, holes 22 can be filled with a liquid or paste-like filler material by screen printing techniques. The filler material prevents collapse of the holes 22 during baking and firing. Then, after firing, the filler material (e.g. wax) could be removed by machining, chemically etching, or by melting it out.

Method of Packaging an electro-microfluidic Device

Figure 26:
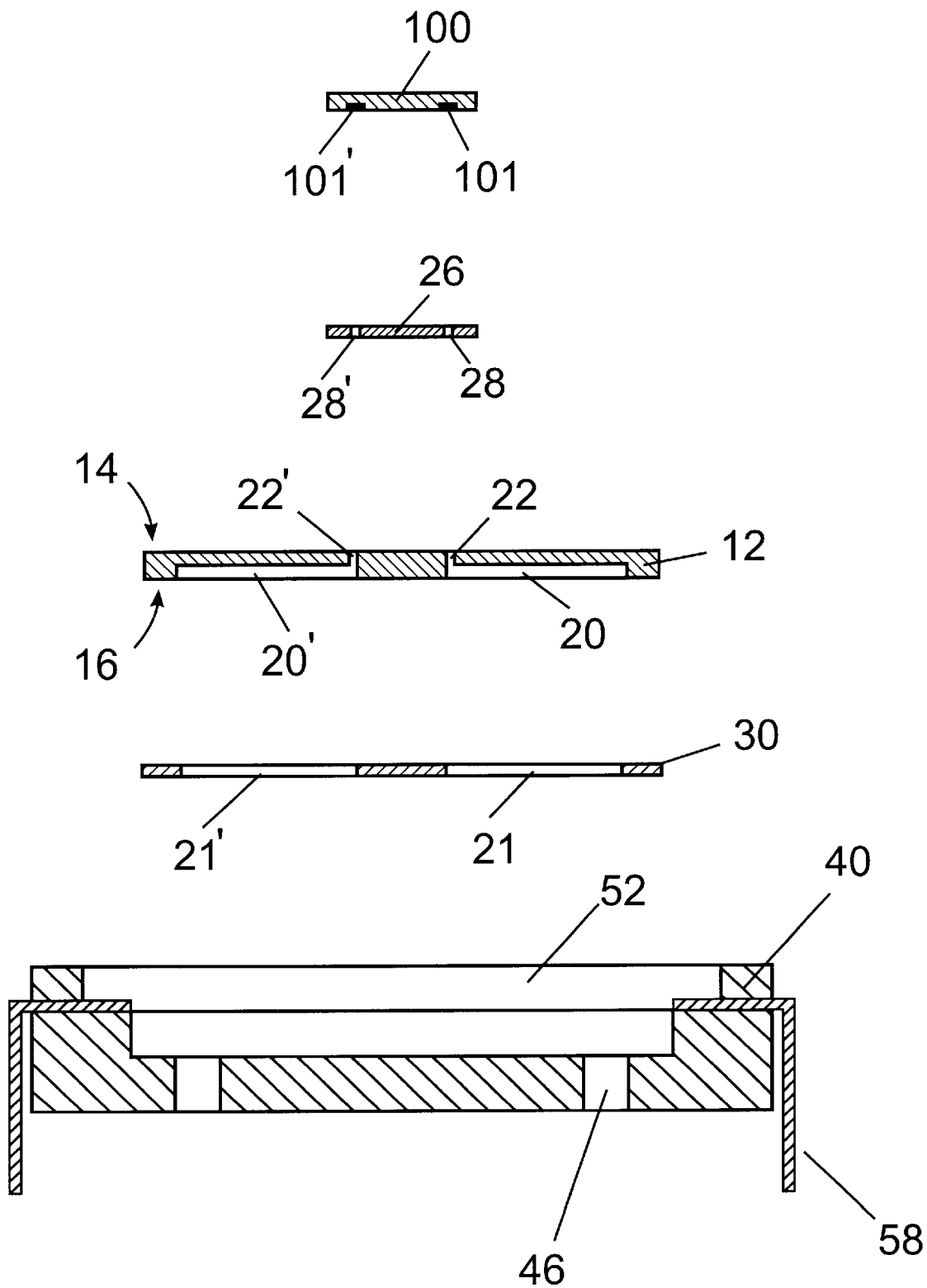
FIG. 26 illustrates an exploded cross-section view of a twenty-eighth example of a method of packaging a electro-microfluidic device, according to the present invention.

FIG. 26 illustrates an exploded cross-section view of a twenty-eighth example of a packaged electro-microfluidic device, according to the present invention. In this example, electrical lead frame 58 has been molded into a plastic base 40. Fluidic passageways 46 can be created, for example, during injection molding by using custom mold features, or by machining the holes after molding. Separately, adhesive layer 26 is attached to substrate 12. After attaching layer 26 to substrate 12, holes 28 and 22 are match-drilled, which provides close alignment. Second adhesive layer 30 is prepared by cutting out or machining penetrations 21, removing any protective paper liner, and then adhering second adhesive layer 30 to lower surface 16 of fan-out substrate 12. Next, substrate 12 is aligned within recessed cavity 52 of base 40, and then attached to base 40 by applying pressure to second adhesive layer 30. Pressure can be applied by using a roller tool, or by creating a vacuum inside the fluidic channels (after plugging upper holes 22, or, conversely, lower holes 46).

Next, any releasable protective paper liner on first adhesive film layer 26 is removed. Then, microelectronic device 100 (with fluidic inlet/outlet ports 101 located on the bottom surface) is precisely aligned with holes 28 in first adhesive layer 26. The two surfaces are pressed together and bonded by the interposed adhesive layer 26. Precise alignment of the ports 101 on device 100 with holes 28 on layer 26 can be achieved by using a commercially available flip-chip bonding apparatus (i.e. jig). A commercially available device, such as the "PICOPLACER" or "FINEPLACER", manufactured by Finetech GmbH of Berlin, Germany can optically align the two mating parts with an accuracy of +/−1 microns, which is more than sufficient for aligning 100 micron diameter holes.

After joining device 100 to layer 26, electrical interconnections from device 100 to electrical bonding locations on base 40 can be made, for example, by making wirebonds 104 to the exposed interior surface of lead 58. After wirebonding, a liquid encapsulant (e.g. epoxy) can be poured into cavity 52, thereby encapsulating device 100, wirebonds 104, and adhesive gasket 26. After encapsulating, an optional cover lid. can be attached by using a polymeric sealant, a liquid adhesive, a solder seal, a glass-frit seal, or a braze joint.

Alternatively, electro-microfluidic device 100 can be flip-chip optically aligned and then joined to substrate 12 with first adhesive layer 26 immediately after holes 28 have been drilled in layer 26 (e.g. prior to joining substrate 12 to base 40).

Another variation in the assembly sequence involves adhering second adhesive layer 30 to base 40 prior to attaching substrate 12 to layer 30. Persons of ordinary skill in the art will recognize other permutations in the assembly sequence.

Figure 27:
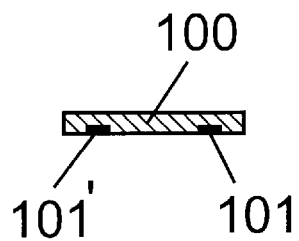
FIG. 27 illustrates an exploded cross-section view of a twenty-ninth example of a method of packaging a electro-microfluidic device, according to the present invention.
Figure 27:
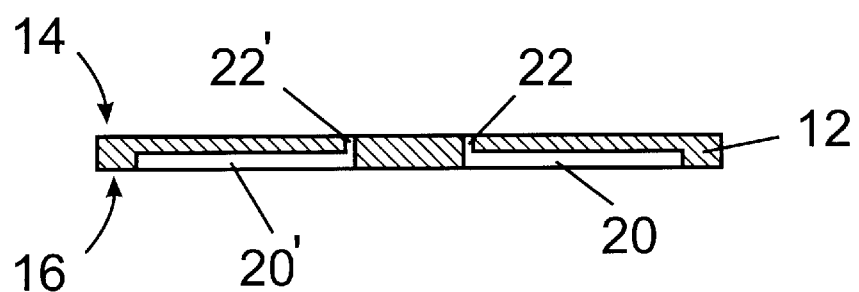
Figure 27:
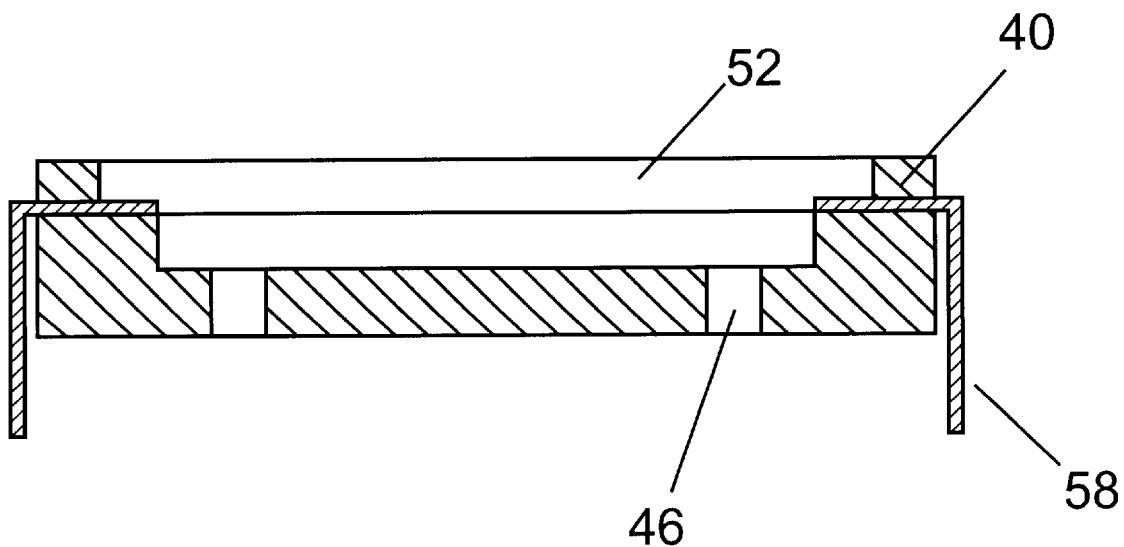

FIG. 27 illustrates an exploded cross-section view of a twenty-ninth example of a packaged electro-microfluidic device, according to the present invention. This assembly is identical to FIG. 26, except that adhesive layers 26 and 30 have been removed and are not used. Attachment of substrate 12 to base 40 and to device 100 is accomplished by activating the surfaces of substrate 12 and making them sticky. If substrate 12 is made of a thermoplastic material, for example, then heating the substrate 12 to a sufficiently high temperature will make the surfaces tacky. Overheating may produce undesirable deformation of the substrate and closure of small holes 22. Alternatively, the surfaces may be activated by application of ultraviolet (UV) radiation. This can be enabled, for example, if base 40 is made of a UV-transparent material. Alternatively, bonding between substrate 12 and base 40 can utilize a thin film of liquid adhesive, activated by heat or UV light. Alternatively, if substrate 12 is made of glass, or has a glass coating, and if device 100 is made of silicon, then anodic bonding can be used to bond device 100 to upper surface 14 of substrate 12. Screen printing can be used to apply a pattern of a thin film of a liquid or paste-like adhesive to selected areas.

Other examples of methods for packaging an electro-microfluidic device will now be described by referring back to previously discussed FIGS. 13–21.

In FIG. 13, electrical leads 58 can be attached to the upper surface 14 of substrate 12 with adhesive layer 64 by aligning the electrical lead frame 58 and applying pressure to promote adhesive contact. Subsequently, epoxy sealant 66 can be filled into hole 62 to provide enhanced mechanical strength to lead 58. Epoxy sealant 66 can optionally replace the use of adhesive layer 64 for attaching lead frame 58. Lead frame 58 can be attached to substrate 12 either prior to, or after, device 100 is attached to adhesive layer 26.

In FIG. 14, device 100 is flip-chip bonded to cantilevered beam lead 59 by optically aligning the corresponding bonding pads and reflowing solder bump 74 to make the electrical interconnection. Preferably, this step is performed after device 100 has been bonded to substrate 12.

In FIG. 15, substrate 12 can be bonded to base 40 by a variety of joining processes, including adhesive joining, soldering, glass sealing, and brazing. Since cavity 79 is open prior to attaching cover lid 68, device 100 can be attached to substrate 12 either before, or after, substrate 12 is joined to base 40.

In FIG. 16, the method of fabrication was previously discussed.

In FIG. 17A, lead frame 58 is adhesively attached to the upper surface of substrate 12, and then wirebond interconnections 104 made, prior to encapsulating the pre-assembly in a molded plastic body 84. Preferably, closeout plate 32 has been attached to substrate 12 by gluing, applying adhesive tape, thermal bonding, chemical bonding, ultrasonic bonding, anodic bonding, soldering, brazing, etc. prior to injection molding. Optionally, plugs (not shown) can be inserted into holes 25 in closeout plate 33 prior to injection molding, to prevent clogging of the fluidic channels and passageways by plastic. After injection molding, cleaning and/or light machining of lower surface 33 can be performed to create a clean and flat surface for subsequent mounting to an external fixture.

In FIG. 17B, substrate 12 comprises a thermoplastic material, which is bonded directly to base 40 and directly to electro-microfluidic device 100, without using an intermediate layer of adhesive film. Thermoplastic substrate 12 is heated to a softening temperature sufficiently high to make it tacky enough to provide adhesion to base 40 and to device 100.

Method of Assembling a Packaged Electro-microfluidic Device

In FIG. 18, package 11 is mounted to fluidic printed wiring board (FPWB) 110 by inserting electrical lead 58 into holes in FPWB 110 and then soldering the electrical joint 90. Simultaneously, the lower surface 16 of substrate 12 is mechanically bonded and fluidically coupled to FPWB 110 by applying pressure to second adhesive layer 30, which has been previously exposed by removing the protective paper liner. Good alignment of the fluidic channels between package 11 and external fixture 110 (e.g. FPWB 110) can be achieved by mechanical alignment of electrical leads with the through-holes in board 110. After mounting package 11, an underfill material 88 can be applied underneath base 40 to provide additional mechanical bonding, and environmental protection to adhesive gasket 30.

FIG. 18 also illustrates an open window 86 in encapsulant layer 76 above device 100. Window 86 can be fabricated by conventional machining, or by wet etching away the plastic encapsulant by operating a commercially available jet etching device (not shown). Window 86 can be manufactured in encapsulant 76 by a variety of techniques, such as disclosed in co-pending, commonly-assigned application, "Pre-Release Plastic Packaging of MEMS and IMEMS Devices", by Peterson and Conley, PTO Ser. No. 09/572,720, which is herein incorporated by reference. Window 86 can provide mechanical, optical or fluidic access to the top surface of device 100. Window 86 can also be used to provide access to perform a wet release etch or dry plasma exposure, thereby releasing MEMS elements located on the upper surface of device 100.

In FIG. 19, assembly 13 can be fabricated by aligning package 11 with corresponding fluidic openings and electrical bonding pads on FPWB 110. Fluidic coupling in this example can be achieved by mechanically compressing O-ring seal 92 with an external clamp (not shown). Electrical interconnection can be made by flip-chip solder bump reflowing solder bump 94. After soldering, underfill material 88 can be applied. After mechanical joining has been achieved by flip-chip soldering and/or underfill bonding, the external mechanical compression of O-ring seal 92 can be released.

In FIG. 20, package 11 is electrically mounted to a printed circuit board 111; however, no fluidic connection is made to board 111. Fluid can be provided to electromicrofuidic device 100 by operating a micropipette to drop drops of fluid into access ports 35 located in closeout plate 32. Alternatively, tubing can be attached to port 35 to supply fluids and reagents. Ports 35 are open to the environment for chemical sniffing.

Method of Assembling an Electro-microfluidic Device on to a Board

In FIG. 21, electro-microfluidic device 100 is directly mounted to fluidic printed wiring board 110. In this example, FPWB 110 takes the place of substrate 12. A flip-chip optical bonding jig can be used to precisely align fluidic ports 101 on device 100 with holes in adhesive gasket 26. After mounting device 100, wirebonds 104 can be made to printed circuit traces 107 on FPWB 110, followed (optionally) by applying a glob-top epoxy overmold protective layer 94.

Release of any MEMS elements located inside of device 100 can be performed by flowing releasing fluids or gases through the interconnected fluidic channels at any stage of the fabrication and assembly process. Preferably, the release step is performed towards the end of handling, joining, and assembling steps, so as to minimize any damage to fragile released MEMS elements.

The particular examples discussed above are cited to illustrate particular embodiments of the invention. Other applications and embodiments of the apparatus and method of the present invention will become evident to those skilled in the art. For example, multiple electro-microfluidic packages 11 may be placed on a single fluidic printed wiring board 110.

The actual scope of the invention is defined by the claims appended hereto.

We claim:

1. A package for housing an electro-microfluidic device comprising:
    a substantially planar substrate having an upper surface, and an opposing lower surface;
    a first fluidic opening disposed on the upper surface of the substrate;
    a second fluidic opening disposed on the lower surface of the substrate;
    a first fluidic channel fluidically connecting the first fluidic opening to the second fluidic opening; and
    a first adhesive layer adhered to the upper surface, having a hole disposed through the layer, wherein the hole is substantially aligned with, and fluidically coupled to, the first fluidic opening in the substrate;
    wherein the substrate further comprises a plurality of tapered fluidic channels arranged in a fan-out pattern.

2. The package of claim 1, further comprising a first standardized array of allowable centerlines of fluidic openings disposed on the upper surface of the substrate.

3. The package of claim 1, wherein the diameter of the second fluidic opening is greater than the diameter of the first fluidic opening.

4. The package of claim 1, wherein the first adhesive layer comprises a pressure-sensitive adhesive tape.

5. The package of claim 4, wherein the pressure-sensitive adhesive tape comprises VHB™ acrylic adhesive transfer tape, having a thickness between about 0.05 mm and 0.25 mm.

6. The package of claim 4, wherein the pressure-sensitive adhesive tape comprises double-sided sticky tape.

7. The package of claim 1, wherein the diameter of the first fluidic opening is about 100 microns.

8. The package of claim 1, further comprising a second adhesive layer bonded to the lower surface of the substrate.

9. The package of claim 1, wherein the first fluidic channel comprises an open trench, having an open side coplanar with the lower surface of the substrate.

10. The package of claim 9, further comprising a second adhesive layer bonded to the lower surface of the substrate; the layer having a cutout pattern that substantially matches, and aligns with, the outline of the open side of the trench.

11. The package of claim 9, further comprising a closeout plate attached to the lower surface of the substrate.

12. The package of claim 1, wherein the substrate comprises an electrically insulating material.

13. The package of claim 12, wherein the electrically insulating material comprises a thermoplastic material.

14. The package of claim 12, wherein the electrically insulating material comprises a ceramic-based material selected from a low-temperature or high-temperature co-fired ceramic multi-layer laminated material.

15. The package of claim 12, further comprising means for electrically connecting the package to an external fixture.

16. A package for housing an electro-microfluidic device comprising:
    a substantially planar substrate having an upper surface, and an opposing lower surface;
    a first fluidic opening disposed on the upper surface of the substrate;
    a second fluidic opening disposed on the lower surface of the substrate;
    a first fluidic channel fluidically connecting the first fluidic opening to the second fluidic opening; and
    a first adhesive layer adhered to the upper surface, having a hole disposed through the layer, wherein the hole is substantially aligned with, and fluidically coupled to, the first fluidic opening in the substrate;
    wherein the substrate comprises an electrically insulating material; and
    further comprising means for electrically connecting the package to an external fixture; and
    further comprising a cavity recessed into the upper surface of the substrate, the cavity having a bottom level and an intermediate level surrounding the bottom level; wherein the first adhesive layer is adhered to the bottom level of the cavity.

17. The package of claim 15, further comprising an electrical lead frame attached to the substrate.

18. The package of claim 15, further comprising a plurality of electrical leads arranged in a standardized DIP arrangement.

19. The package of claim 1, further comprising a substantially planar base attached to the lower surface of the substrate; wherein the base comprises:
    an upper base surface;
    a lower base surface;
    a third fluidic opening disposed on the upper base surface;
    a fourth fluidic opening disposed on the lower base surface; and
    a second fluidic channel fluidically connecting the third fluidic opening to the fourth fluidic opening;
    wherein the third fluidic opening on the base aligns with, and fluidically couples to, the second fluidic opening on the substrate.

20. The package of claim 19, further comprising a plurality of fluidic channels fluidically connecting the upper base surface to the lower base surface, wherein the centerlines of the fluidic openings disposed on the lower base surface are arranged in a third standardized array.

21. The package of claim 19, wherein a second adhesive layer mechanically joins, and fluidically couples, the base to the substrate.

22. A package for housing an electro-microfluidic device comprising:
    a substantially planar substrate having an upper surface, and an opposing lower surface;
    a first fluidic opening disposed on the upper surface of the substrate;
    a second fluidic opening disposed on the lower surface of the substrate;
    a first fluidic channel fluidically connecting the first fluidic opening to the second fluidic opening; and
    a first adhesive layer adhered to the upper surface, having a hole disposed through the layer, wherein the hole is substantially aligned with, and fluidically coupled to, the first fluidic opening in the substrate;
    further comprising a substantially planar base attached to the lower surface of the substrate; wherein the base comprises:
    an upper base surface;
    a lower base surface;
    a third fluidic opening disposed on the upper base surface;
    a fourth fluidic opening disposed on the lower base surface; and
    a second fluidic channel fluidically connecting the third fluidic opening to the fourth fluidic opening;
    wherein the third fluidic opening on the base aligns with, and fluidically couples to, the second fluidic opening on the substrate; and
    further comprising a cavity recessed into the upper surface of the base, wherein the substrate is housed within this cavity.

23. The package of claims 19, further comprising means for electrically connecting the base to an external fixture.

24. The package of claim 23, further comprising a plurality of electrical leads arranged in a standardized DIP arrangement.

25. The package of claim 1, further comprising a substantially planar base attached to the upper surface of the substrate; wherein the base comprises:
    an upper base surface;
    a lower base surface;
    a cavity disposed inside of the base; and
    means for electrically connecting the base to an external fixture.

26. A package for housing an electro-microfluidic device comprising:
    a substantially planar substrate having an upper surface, and an opposing lower surface;
    a first fluidic opening disposed on the upper surface of the substrate;
    a second fluidic opening disposed on the lower surface of the substrate;

a first fluidic channel fluidically connecting the first fluidic opening to the second fluidic opening; and a first adhesive layer adhered to the upper surface, having a hole disposed through the layer, wherein the hole is substantially aligned with, and fluidically coupled to, the first fluidic opening in the substrate; and further comprising a substantially planar base attached to the upper surface of the substrate; wherein the base comprises:

an upper base surface;

a lower base surface;

a cavity disposed inside of the base; and means for electrically connecting the base to an external fixture; and further comprising a step located between the lower base surface and the external fixture.

27. A package for housing an electro-microfluidic device comprising:

a substantially planar substrate having an upper surface, and an opposing lower surface;

a first fluidic opening disposed on the upper surface of the substrate;

a second fluidic opening disposed on the lower surface of the substrate;

a first fluidic channel fluidically connecting the first fluidic opening to the second fluidic opening; and a first adhesive layer adhered to the upper surface, having a hole disposed through the layer, wherein the hole is substantially aligned with, and fluidically coupled to, the first fluidic opening in the substrate; and further comprising a substantially planar frame surrounding the substrate; wherein the frame comprises means for electrically connecting the frame to an external fixture.

28. The package of claim 27, further comprising a cantilevered beam lead protruding from the frame over the substrate.

29. A package for housing an electro-microfluidic device comprising:

a substantially planar substrate having an upper surface, and an opposing lower surface; a first fluidic opening disposed on the upper surface of the substrate; a second fluidic opening disposed on the lower surface of the substrate; and a first fluidic channel fluidically connecting the first fluidic opening to the second fluidic opening; and a substantially planar base bonded to the lower surface of the substrate; wherein the base comprises a second fluidic channel fluidically connected to the first fluidic channel; and means for electrically interconnecting an electro-microfluidic device to an external fixture;

wherein the substrate comprises a thermoplastic material; and further wherein the substrate is bonded directly to the base without using an intermediate layer of adhesive film disposed in-between the base and the substrate.

30. The package of claim 1, further comprising an electro-microfluidic device bonded to the first adhesive layer; wherein the device has a fluidic access port that aligns with, and fluidically couples to, the hole in the first adhesive layer.

31. The package of claim 30, further comprising means for electrically interconnecting the electro-microfluidic device to an external fixture.

32. The package of claim 31, further comprising a wirebonded electrical interconnection between the electro-microfluidic device and the external fixture.

33. A packaged electro-microfluidic device, comprising:

a substantially planar substrate having an upper surface, and an opposing lower surface;

a first fluidic opening disposed on the upper surface of the substrate;

a second fluidic opening disposed on the lower surface of the substrate;

a first fluidic channel fluidically connecting the first fluidic opening to the second fluidic opening; and a first adhesive layer adhered to the upper surface, having a hole disposed through the layer, wherein the hole is substantially aligned with, and fluidically coupled to, the first fluidic opening in the substrate; and an electro-microfluidic device bonded to the first adhesive layer; wherein the device has a fluidic access port that aligns with, and fluidically couples to, the hole in the first adhesive layer;

further comprising means for electrically interconnecting the electro-microfuidic device to an external fixture; and further comprising a wirebonded electrical interconnection between the electro-microfluidic device and the external fixture;

wherein the substrate and attached electro-microfluidic device are substantially encapsulated inside of a plastic body.

34. The package of claim 31, further comprising a solder-bumped electrical interconnection between the electro-microfluidic device and the external fixture.

35. The package of claim 1, further comprising an electro-microfluidic device housed inside of the package; wherein the package is mechanically attached, electrically interconnected, and fluidically coupled to an external fixture having embedded fluidic channels and electrical elements.

36. The package of claim 35, wherein the electrical interconnection comprises a push-through surface mounting arrangement selected from the group consisting of a Dual In-Line Package (DIP), a Ceramic Dual In-Line Package (CERDIP), a Single In-Line Package (SIP), a Pin-Grid Array (PGA), a zig-zag QUIP package, and a Zero-Insertion-Force, socket (ZIF) mount.

37. The package of claim 35, wherein the electrical interconnection comprises a flush surface mounting arrangement selected from the group consisting of a Quad Flat Pack package, a Flip-Chip solder bump mount, a leadless chip carrier mount, a plastic leaded chip carrier mount, a Ball-Grid Array (BGA) mount, a Plastic Ball-Grid Array (PBGA), a beam lead mount, a Tape Automated Bonding (TAB) mount, and a wire bonded interconnection.

38. The package of claim 35, wherein the fluidic coupling comprises a fluidic joint selected from the group consisting of a compliant gasket, an O-ring seal, an adhesive gasket, and a solder sealring.

39. The package of claim 35, wherein the package is encapsulated in a protective polymeric material.

40. The package of claim 35, wherein the external fixture comprises a fluidic printed wiring board.

41. An electro-microfluidic assembly, comprising:

an electro-microfluidic device housed inside of a package, wherein the package is mechanically attached, electrically interconnected, and fluidically coupled to an external fixture having embedded fluidic channels and electrical elements;

wherein the external fixture comprises a fluidic printed wiring board; and wherein the fluidic printed wiring board comprises a glass microcapillary tube embedded within the board.

42. An electro-microfluidic assembly, comprising:

an electro-microfluidic device housed inside of a package, wherein the package is mechanically attached, electrically interconnected, and fluidically coupled to an external fixture having embedded fluidic channels and electrical elements;

wherein the external fixture comprises a fluidic printed wiring board; and further comprising a glass microcapillary tube fluidically coupled to a fluidic channel embedded within the fluidic printed wiring board.

43. An electro-microfluidic assembly, comprising:

an electro-microfluidic device mechanically attached, electrically interconnected, and fluidically coupled directly to a fluidic printed wiring board;

wherein the fluidic printed wiring board comprises a plurality of fluidic channels arranged in a fan-out pattern.

44. The assembly of claim 43, wherein an adhesive layer mechanically joins, and fluidically couples, the electro-microfluidic device directly to the fluidic printed wiring board.

45. The assembly of claim 43, wherein the electro-microfluidic device is electrically wirebonded to the fluidic printed wiring board.

46. The assembly of claim 45, wherein the wirebonded interconnection is encapsulated in a protective polymeric material.

47. The assembly of claim 43, wherein the electrical interconnection between the electro-microfluidic device and the fluidic printed wiring board comprises a flip-chip solder bumped joint.

48. A base for housing an electro-microfluidic device comprising a substantially planar member having:

an upper surface;

an opposing lower surface;

a plurality of fluid passageways connecting the upper and lower surfaces; and means, attached to the base, for electrically connecting the base to an external fixture; and further comprising a cavity recessed into the upper surface of the base.

49. The base of claim 48, further comprising an electrical lead frame attached to the base.

50. The base of claim 48, further comprising a plurality of electrical connectors arranged in a standardized DIP geometry.

51. The base of claim 48, further comprising an adhesive layer adhered to the lower surface of the base.

52. The package of claim 1, wherein the first adhesive layer comprises a film of adhesive selected from the group consisting of a liquid film of adhesive, a spayed film of adhesive, an evaporated film of adhesive, and a vapor deposited film of adhesive.

53. The package of claim 2, wherein the first standardized array of allowable centerlines of fluidic openings disposed on the upper surface of the substrate comprises a 4×8 array of centerlines.

54. The package of claim 12, wherein the electrically insulating material comprises a material selected from the group consisting of ceramic, polymer, plastic, glass, glass-ceramic composite, glass-polymer composite, resin material, fiber-reinforced composite, glass-coated metal, printed wiring board composition, FR-4, epoxy-glass composite, epoxy-kevlar composite, polyamide, TEFLON™, PEEK, alumina, beryllium oxide, silicon nitride, aluminum nitride, titanium nitride, titanium carbide, silicon carbide, a multi-layered material, a low-temperature co-fired ceramic multilayered material, and a high-temperature co-fired ceramic multilayered material.

55. The package of claim 19, further comprising a cavity recessed into the upper surface of the base, wherein the substrate is housed within this cavity.

56. The package of claim 19, wherein the base comprises a low-temperature or a high-temperature co-fired ceramic multilayered material.

57. The package of claim 16, wherein the base comprises a low-temperature or a high-temperature co-fired ceramic multilayered material.

58. The package of claim 1, wherein the substrate comprises a plurality of fluidic openings disposed on the lower surface of the substrate, wherein the centerlines of the fluidic openings disposed on the lower surface of the substrate are arranged in a second standardized array.

59. The package of claim 58, wherein the second standardized array comprises a 2×4 array of openings.

60. The package of claim 22, wherein the base comprises a material selected from the group consisting of ceramic, polymer, plastic, glass, glass-ceramic composite, glass-polymer composite, resin material, fiber-reinforced composite, glass-coated metal, printed wiring board composition, FR-4, epoxy-glass composite, epoxy-kevlar composite, polyamide, TEFLON™, PEEK, alumina, beryllium oxide, silicon nitride, aluminum nitride, titanium nitride, titanium carbide, silicon carbide, a multi-layered material, a low-temperature co-fired ceramic multilayered material, and a high-temperature co-fired ceramic multilayered material.

61. The package of claim 22, further comprising a second layer of adhesive material disposed in-between the substrate and the base.

62. The package of claim 22, further comprising an electro-microfluidic device bonded to the first adhesive layer;

wherein the device has a fluidic access port that aligns with, and fluidically couples to, the hole in the first adhesive layer;

wherein the first adhesive layer provides simultaneous mechanical bonding, sealing, and fluidic coupling of the device to the substrate;

wherein the base comprises base interconnection means for electrically connecting the electro-microfluidic device to an external fixture; and wherein the electro-microfluidic device is electrically interconnected to the base interconnection means.

63. The package of claim 62, wherein the fluidic access port of the electro-microfluidic device has a diameter equal to or greater than 10 microns.

64. The package of claim 22, further comprising a plurality of fluidic channels fluidically connecting the upper base surface to the lower base surface, wherein the centerlines of the fluidic openings disposed on the lower base surface are arranged in a third standardized array.

65. The package of claim 64, wherein the third standardized array of centerlines of the fluidic openings disposed on the lower base surface comprises a 2×4 array of holes.

66. The package of claim 62, wherein the base is mechanically attached, electrically interconnected, and fluidically coupled to a fluidic printed circuit board having embedded fluidic channels and electrical conductors disposed on the surface of the board.

67. The package of claim 66, wherein the base is mechanically attached and fluidically coupled to the fluidic printed circuit board using a third layer of adhesive material disposed in-between the base and the board.

68. The package of claim 66, wherein the base interconnection means comprises a push-through surface mounting arrangement selected from the group consisting of a Dual In-Line Package (DIP), a Ceramic Dual In-Line Package (CERDIP), a Single In-Line Package (SIP), a Pin-Grid Array (PGA), a zig-zag QUIP package, and a Zero-Insertion-Force socket (ZIF) mount.

69. The package of claim 66, wherein the base interconnection means comprises a flush surface mounting arrangement selected from the group consisting of a Quad Flat Pack package, a Flip-Chip solder bump mount, a leadless chip carrier mount, a plastic leaded chip carrier mount, a Ball-Grid Array (BGA) mount, a Plastic Ball-Grid Array (PBGA), a beam lead mount, a Tape Automated Bonding (TAB) mount, and a wire bonded interconnection.

70. The package of claim 31, wherein the means for electrically interconnecting the electro-microfluidic device to the external fixture comprises a plurality of electrical conductors disposed on the upper surface of the substrate.

71. The package of claim 28,
further comprising an electro-microfluidic device bonded to the first adhesive layer;
wherein the device has a fluidic access port that aligns with, and fluidically couples to, the hole in the first adhesive layer;
wherein the first adhesive layer provides simultaneous mechanical bonding, sealing, and fluidic coupling of the device to the substrate;
wherein the cantilevered beam lead is at least partially embedded within the frame; and
wherein the electro-microfluidic device is electrically interconnected to the cantilevered beam lead via a solder-bumped joint.

72. The package of claim 71, wherein the open space inside of the frame is filled with a liquid encapsulant that subsequently hardens and provides mechanical support.

73. The package of claim 48, wherein the means for electrically connecting the base to an external fixture comprises a push-through surface mounting arrangement selected from the group consisting of a Dual In-Line Package (DIP), a Ceramic Dual In-Line Package (CERDIP), a Single In-Line Package (SIP), a Pin-Grid Array (PGA), a zig-zag QUIP package, and a Zero-Insertion-Force socket (ZIF) mount.

74. The package of claim 48, wherein the means for electrically connecting the base to an external fixture comprises a flush surface mounting arrangement selected from the group consisting of a Quad Flat Pack package, a Flip-Chip solder bump mount, a leadless chip carrier mount, a plastic leaded chip carrier mount, a Ball-Grid Array (BGA) mount, a Plastic Ball-Grid Array (PBGA), a beam lead mount, a Tape Automated Bonding (TAB) mount, and a wire bonded interconnection.

75. A package for housing an electro-microfluidic device comprising:
a substantially planar substrate having an upper surface, and an opposing lower surface;
a first fluidic opening disposed on the upper surface of the substrate;
a second fluidic opening disposed on the lower surface of the substrate;
a first fluidic channel fluidically connecting the first fluidic opening to the second fluidic opening;
wherein the substrate further comprises a plurality of fluidic channels arranged in a fan-out pattern; and
further comprising an electro-microfluidic device bonded to the upper surface of the substrate without having an intermediate layer of adhesive disposed in-between the device and the substrate;
wherein the device has a fluidic access port that aligns with, and fluidically couples to, the first fluidic opening disposed on the upper surface of the substrate.

76. The package of claim 75,
wherein the substrate comprises a thermoplastic material; and
wherein the electro-microfluidic device is bonded to the substrate by heating the thermoplastic material to a sufficiently high temperature to make the surfaces of the substrate sticky.

77. The package of claim 75, wherein the substrate comprises glass and the electro-microfluidic device comprises silicon.

78. The package of claim 77, wherein the electro-microfluidic device is bonded to the substrate by using anodic bonding to join silicon to glass.

* * * * *